(12) United States Patent
Tsai et al.

(10) Patent No.: US 12,142,579 B2
(45) Date of Patent: *Nov. 12, 2024

(54) PACKAGE STRUCTURE AND MANUFACTURING METHOD THEREOF

(71) Applicant: Taiwan Semiconductor Manufacturing Company, Ltd., Hsinchu (TW)

(72) Inventors: Tsung-Fu Tsai, Changhua County (TW); Shih-Ting Lin, Taipei (TW); Szu-Wei Lu, Hsinchu (TW); Chen-Hsuan Tsai, Taitung (TW); I-Ting Huang, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/354,633

(22) Filed: Jul. 18, 2023

(65) Prior Publication Data
US 2023/0361052 A1 Nov. 9, 2023

Related U.S. Application Data

(63) Continuation of application No. 17/739,186, filed on May 9, 2022, which is a continuation of application
(Continued)

(51) Int. Cl.
*H01L 21/48* (2006.01)
*H01L 21/683* (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC .............. H01L 23/562; H01L 23/5385; H01L 23/5386; H01L 21/6835; H01L 23/5383;
(Continued)

(56) References Cited

U.S. PATENT DOCUMENTS 8,143,531 B2 * 3/2012 Miki ................. H01L 23/49827
174/262
8,319,328 B2 * 11/2012 Takahashi ............ H01L 23/585
438/109
(Continued)

*Primary Examiner* — Vu A Vu
(74) *Attorney, Agent, or Firm* — JCIPRNET

(57) ABSTRACT

A package structure includes a redistribution circuit structure, a wiring substrate, an insulating encapsulation, and a reinforcement structure. The redistribution circuit structure has dielectric layers. The wiring substrate is disposed on the redistribution circuit structure. The insulating encapsulation laterally encapsulates the wiring substrate. The reinforcement structure includes reinforcement pattern layers and reinforcement vias. The reinforcement pattern layers and the dielectric layers are stacked alternately. The reinforcement vias penetrate through the dielectric layers to connect the reinforcement pattern layers. At least one of the reinforcement pattern layers is embedded in the insulating encapsulation. The reinforcement structure is electrically floating.

20 Claims, 27 Drawing Sheets

Related U.S. Application Data

No. 16/944,102, filed on Jul. 30, 2020, now Pat. No. 11,355,454.

(51) Int. Cl.
*H01L 23/00* (2006.01)
*H01L 23/538* (2006.01)

(52) U.S. Cl.
CPC ...... *H01L 21/6835* (2013.01); *H01L 23/5383* (2013.01); *H01L 23/5385* (2013.01); *H01L 23/5386* (2013.01); *H01L 24/16* (2013.01); *H01L 2221/68359* (2013.01); *H01L 2224/16227* (2013.01); *H01L 2924/35121* (2013.01)

(58) Field of Classification Search
CPC . H01L 21/4857; H01L 24/16; H01L 21/4853; H01L 2224/16227; H01L 2221/68359; H01L 2924/35121

USPC ........................................................ 257/668
See application file for complete search history.

(56) References Cited

U.S. PATENT DOCUMENTS

| | | | |
|---|---|---|---|
| 8,507,806 B2* | 8/2013 | Kariya | H01L 21/4857 174/262 |
| 9,111,930 B2* | 8/2015 | Wu | H01L 23/49827 |
| 10,340,238 B2* | 7/2019 | Furuichi | H01L 23/3128 |
| 11,133,273 B2* | 9/2021 | Vincent | H01L 23/49833 |
| 11,769,739 B2* | 9/2023 | Tsai | H01L 23/562 257/668 |
| 2018/0204820 A1* | 7/2018 | Zhai | H01L 23/3135 |
| 2021/0020600 A1* | 1/2021 | Jang | H01L 21/6835 |
| 2021/0035949 A1* | 2/2021 | Huang | H01L 24/81 |

* cited by examiner

PACKAGE STRUCTURE AND MANUFACTURING METHOD THEREOF

CROSS-REFERENCE TO RELATED APPLICATION

This application is a continuation application of and claims the priority benefit of a prior application Ser. No. 17/739,186, filed on May 9, 2022, now allowed. The prior application Ser. No. 17/739,186 is a continuation application of and claims the priority benefit of a prior application Ser. No. 16/944,102, filed on Jul. 30, 2020, now patented. The entirety of each of the above-mentioned patent applications is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as lower power consumption and latency has grown recently, there has grown a need for smaller and more creative packaging techniques of semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
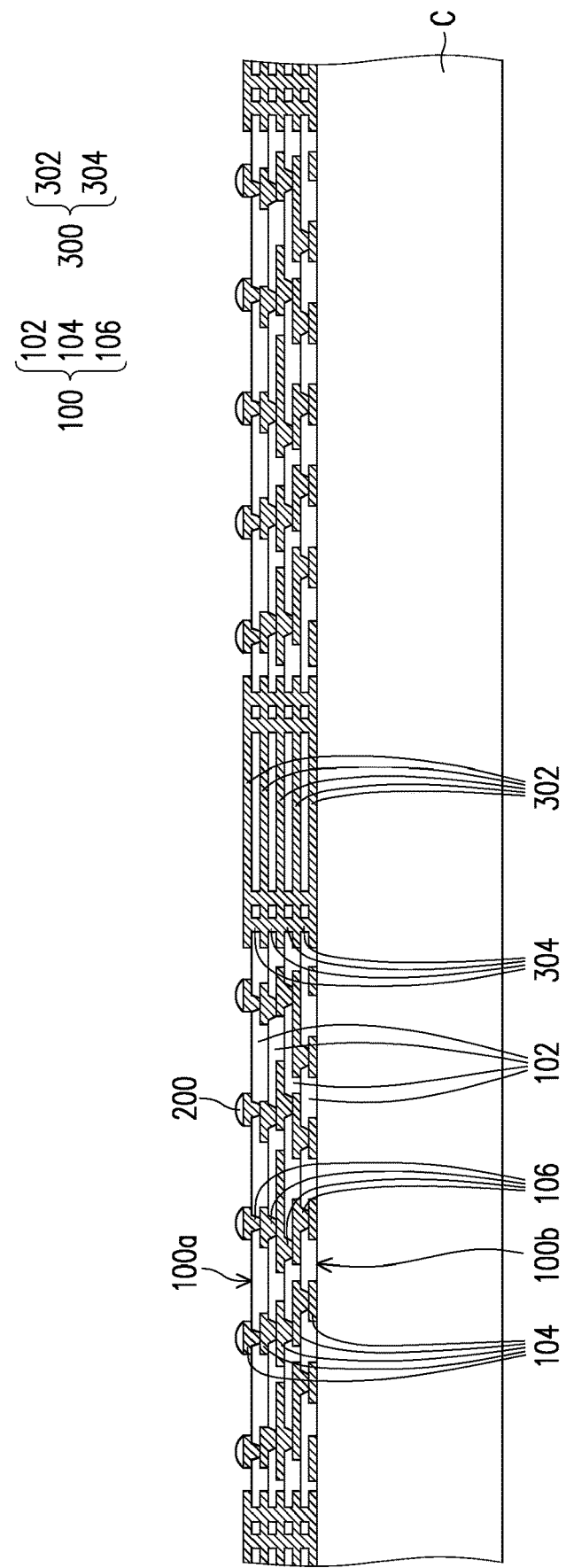
FIG. 1A to FIG. 1G are schematic cross-sectional views illustrating a manufacturing process of a package structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are schematic cross-sectional views illustrating a manufacturing process of a package structure 10 in accordance with some embodiments of the disclosure. Referring to FIG. 1A, a carrier C is provided. The carrier C includes, for example, silicon-based materials, such as a silicon substrate, a glass material, silicon oxide, or other materials, such as aluminum oxide, the like, or a combination thereof. In some embodiments, the carrier C is in wafer form. For example, the carrier C has a circular shape. However, the disclosure is not limited thereto. In some alternative embodiments, the carrier is in panel form. For example, the carrier C has a rectangular shape. The carrier C may be planar in order to accommodate the formation of additional features subsequently formed thereon.

As illustrated in FIG. 1A, a redistribution circuit structure 100 is formed on the carrier C. In some embodiments, the redistribution circuit structure 100 includes a plurality of dielectric layer 102, a plurality of conductive pattern layers 104, and a plurality of conductive vias 106. In some embodiments, the dielectric layers 102 and the conductive pattern layers 104 are stacked alternately. On the other hand, the conductive vias 106 are embedded in the dielectric layers 102. In some embodiments, the conductive pattern layers 104 are interconnected with one another through the conductive vias 106. For example, the conductive vias 106 penetrate through the dielectric layers 102 to connect the conductive pattern layers 104. In some embodiments, each conductive pattern layer 104 includes a plurality of conductive patterns serving as redistribution wirings. In some embodiments, the conductive patterns of the topmost conductive pattern layer 140 shown in FIG. 1A may be referred to as "conductive pads." In some embodiments, the conductive pattern layers 104 transmit signal horizontally and the conductive vias transmit signal vertically.

In some embodiments, a material of the dielectric layer 102 includes polyimide, epoxy resin, acrylic resin, phenolic resin, benzocyclobutene (BCB), polybenzooxazole (PBO), or any other suitable polymer-based dielectric material. In some embodiments, the dielectric layers 102 includes resin mixed with filler. The dielectric layers 102 may be formed by suitable fabrication techniques, such as film lamination, spin-on coating, chemical vapor deposition (CVD), plasma enhanced chemical vapor deposition (PECVD), or the like. In some embodiments, a material of the conductive pattern layers 104 and the conductive vias 106 includes aluminum, titanium, copper, nickel, tungsten, or alloys thereof. The conductive pattern layers 104 and the conductive vias 106 may be formed by electroplating, deposition, and/or photolithography and etching. In some embodiments, the conductive pattern layers 104 and the underlying conductive vias 106 may be formed simultaneously. It should be noted that the number of the dielectric layers 102, the number of the conductive pattern layers 104, and the number of the conductive vias 106 illustrated in FIG. 1A are merely for illustrative purposes, and the disclosure is not limited thereto. In some alternative embodiments, fewer or more layers of the dielectric layers 102, the conductive pattern layers 104, and the conductive vias 106 may be formed depending on the circuit design.

In some embodiments, the redistribution circuit structure 100 has a first surface 100a and a second surface 100b opposite to the first surface 100a. As illustrated in FIG. 1A, the second surface 100b is attached to the carrier C. However, the disclosure is not limited thereto. In some alternative embodiments, a release layer (not shown) and/or an adhesive layer (not shown) may be interposed between the second surface 100b of the redistribution circuit structure 100 and the carrier C.

In some embodiments, a plurality of conductive coatings 200 is formed over the redistribution circuit structure 100. For example, the conductive coatings 200 are formed over the topmost conductive pattern layer 140. That is, the conductive coatings 200 are formed over the conductive pads. In some embodiments, the conductive coatings 200 include solder material. In some embodiments, the conductive coatings 200 are formed through a printing process of pre-solder material.

In some embodiments, a plurality of reinforcement structures 300 are also formed over the carrier C. In some embodiments, each reinforcement structure 300 includes a plurality of reinforcement pattern layers 302 and a plurality of reinforcement vias 304. As illustrated in FIG. 1A, the reinforcement structures 300 are partially embedded in the redistribution circuit structure 100. For example, the reinforcement pattern layers 302 of the reinforcement structure 300 and the dielectric layers 102 of the redistribution circuit structure 100 are stacked alternately. On the other hand, the reinforcement vias 304 penetrate through the dielectric layers 102 to connect the reinforcement pattern layers 302. In some embodiments, each reinforcement structure 300 exhibits a ring shape from a top view. For example, each reinforcement structure 300 is formed to surround the conductive pattern layers 104 and the conductive vias 106 of the redistribution circuit structure 100.

In some embodiments, the redistribution circuit structure 100 and the reinforcement structures 300 are simultaneously formed. For example, the conductive pattern layer 104 and the corresponding reinforcement pattern layer 302 located at the same level height are simultaneously formed. Similarly, the conductive vias 106 and the corresponding reinforcement vias 304 located at the same level height are also simultaneously formed. Since the redistribution circuit structure 100 and the reinforcement structures 300 can be formed through the same process, formation of the reinforcement structures 300 is compatible with current process and does not increase additional fabrication cost.

In some embodiments, the reinforcement structures 300 are made of conductive materials. For example, the reinforcement pattern layers 302 and the conductive pattern layers 104 are made of the same material. Similarly, the reinforcement vias 304 and the conductive vias 106 are also made of the same material. However, the disclosure is not limited thereto. In some alternative embodiments, materials of the reinforcement pattern layers 302, the conductive patterns layers 104, the reinforcement vias 304, and the conductive vias 106 may be different. In some embodiments, the material of the reinforcement pattern layers 302 and the reinforcement vias 304 includes aluminum, titanium, copper, nickel, tungsten, or alloys thereof. The reinforcement pattern layers 302 and the reinforcement vias 304 may be formed by electroplating, deposition, and/or photolithography and etching. In some embodiments, the reinforcement pattern layers 302 and the underlying reinforcement vias 304 may be formed simultaneously. It should be noted that although the reinforcement vias 304 located at different level heights are illustrated as stacked on one another in FIG. 1A, the disclosure is not limited thereto. In some alternative embodiments, the reinforcement vias 304 located at different level heights may be arranged in a staggered manner.

In some embodiments, the reinforcement structures 300 are electrically floating. For example, the reinforcement structures 300 are electrically isolated from other components in the redistribution circuit structure 100 and other components in the subsequently formed package structure.

Figure 1B:
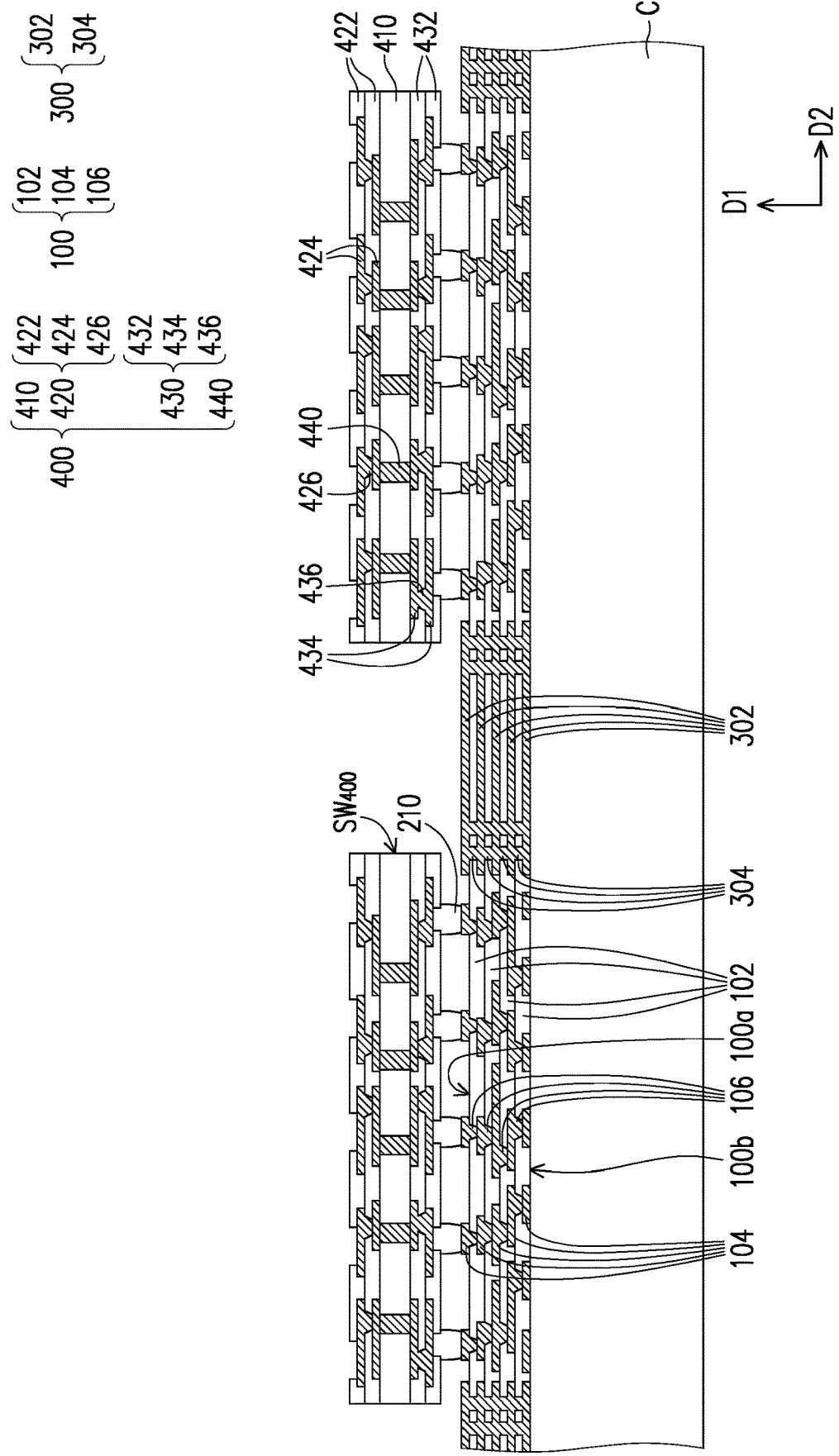

Referring to FIG. 1B, a plurality of wiring substrates 400 is mounted on the first surface 100a of the redistribution circuit structure 100. In some embodiments, each wiring substrate 400 includes a core layer 401, routing structures 420, 430, and a plurality of through vias 440. In some embodiments, the core layer 401 includes a pre-impregnated composite fiber (prepreg) material, an epoxy, a molding compound, Ajinomoto build-up film (ABF), an epoxy molding compound, fiberglass-reinforced resin materials, printed circuit board (PCB) materials, silica filler, polymer materials, polyimide materials, paper, glass fiber, non-woven glass fabric, glass, ceramic, other laminates, the like, or a combination thereof. In some alternative embodiments, the core layer 410 may be a double-sided copper-clad laminate (CCL) substrate or the like.

As illustrated in FIG. 1B, the routing structure 420 and the routing structure 430 are disposed on two opposite sides of the core layer 410. In some embodiments, the routing structure 420 includes a plurality of dielectric layers 422, a plurality of conductive pattern layers 424, and a plurality of conductive vias 426. In some embodiments, the dielectric layers 422 and the conductive pattern layers 424 are stacked alternately. On the other hand, the conductive vias 426 are embedded in the dielectric layers 422. In some embodiments, the conductive pattern layers 424 are interconnected with one another through the conductive vias 426. For example, the conductive vias 426 penetrate through the dielectric layers 422 to connect the conductive pattern layers 424. In some embodiments, the dielectric layers 422 includes a build-up material, ABF, a prepreg material, a laminate material, or a solder resist material. Alternatively, the dielectric layers 422 may be made of polyimide, epoxy resin, acrylic resin, phenolic resin, BCB, PBO, or any other suitable polymer-based dielectric material. The dielectric layers 424 may be formed by suitable fabrication techniques, such as lamination, spin-on coating, CVD, PECVD, or the like. In some embodiments, a material of the conductive pattern layers 424 and the conductive vias 426 includes aluminum, titanium, copper, nickel, tungsten, or alloys thereof. The conductive pattern layers 424 and the conductive vias 426 may be formed by electroplating, deposition, and/or photolithography and etching.

In some embodiments, the routing structure 430 includes a plurality of dielectric layers 432, a plurality of conductive pattern layers 434, and a plurality of conductive vias 436. In some embodiments, the dielectric layers 432 and the conductive pattern layers 434 are stacked alternately. On the other hand, the conductive vias 436 are embedded in the dielectric layers 432. In some embodiments, the conductive pattern layers 434 are interconnected with one another through the conductive vias 436. For example, the conductive vias 436 penetrate through the dielectric layers 432 to connect the conductive pattern layers 434. The dielectric layers 432, the conductive pattern layers 434, and the conductive vias 434 of the routing structure 430 are respectively similar to the dielectric layers 422, the conductive pattern layers 424, and the conductive vias 424 of the routing structure 420, so the detailed descriptions thereof are omitted herein.

In some embodiments, the through vias 440 are formed to penetrate through the core layer 410. For example, the through vias 440 penetrate through the core layer 410 to electrically connect the conductive pattern layers 424 of the routing structure 420 and the conductive pattern layers 434 of the routing structure 430. In some embodiments, a material of the through vias 440 includes aluminum, titanium, copper, nickel, tungsten, or alloys thereof.

In some embodiments, a plurality of external connectors (not shown) is attached to the outermost conductive pattern layer 434. The external connectors may include solder posts or solder bumps arranged in array. Subsequently, the wiring substrates 400 having the external connectors formed thereon may be placed over the first surface 100a of the redistribution circuit structure 100. In some embodiments, the wiring substrates 400 may be placed through a picked-and-placed process. In some embodiments, the wiring substrates 400 are placed such that the external connectors are attached to the corresponding conductive coatings 200. Once the external connectors and the conductive coatings 200 are in physical contact, a reflow process is performed to bond the external connectors and the conductive coatings 200. For example, after the reflow process, the external connectors and the conductive coatings 200 reshape together to form conductive terminals 210. In some embodiments, the conductive terminals 210 connect the wiring substrates 400 and the redistribution circuit structure 100. For example, the wiring substrates 400 are electrically connected to the conductive pattern layers 104 of the redistribution circuit structure 100 through the conductive terminals 210. As illustrated in FIG. 1B, after the wiring substrates 400 are mounted on the first surface 100a of the redistribution circuit structure 100, the reinforcement structures 300 are spaced apart from the wiring substrates 400. The relative configuration of the wiring substrate 400 and the reinforcement structure 300 will be described below in conjunction with FIG. 2.

Figure 2:
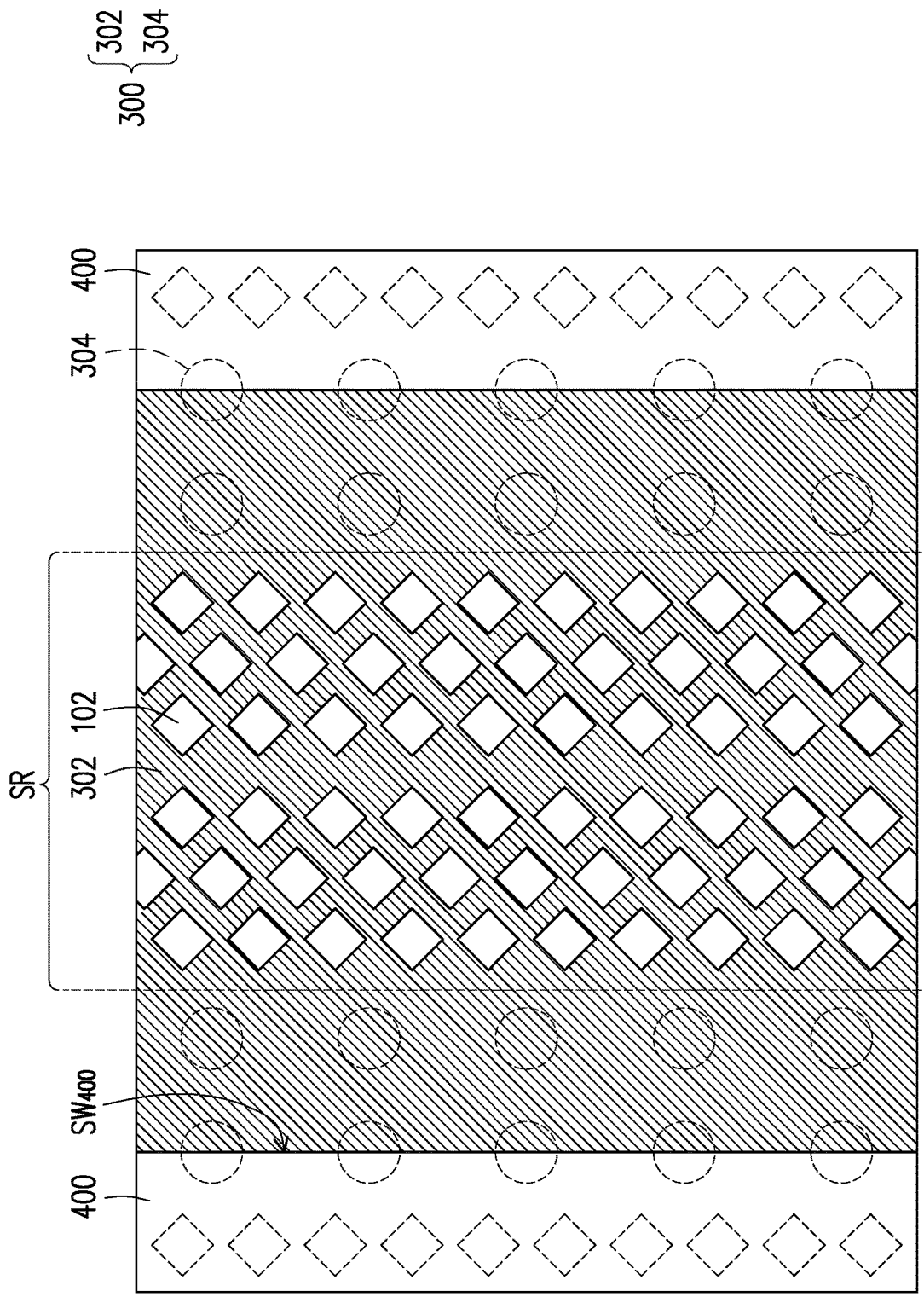
FIG. 2 is a schematic partial top view of the wiring substrate and the reinforcement structure in FIG. 1B.

FIG. 2 is a schematic partial top view of the wiring substrate 400 and the reinforcement structure 300 in FIG. 1B. Referring to FIG. 1B and FIG. 2, sidewalls $SW_{400}$ of the wiring substrate 400 are overlapped with the reinforcement structures 300 along a direction D1 perpendicular to the first surface 100a of the redistribution circuit structure 100. For example, when the first surface 100a of the redistribution circuit structure 100 extends along a direction D2, a vertical projection of the wiring substrate 400 onto the reinforcement structure 300 along the direction D1 is partially overlapped with the reinforcement structure 300. That is, the reinforcement structure 300 is overlapped with a peripheral region of the wiring substrate 400. In some embodiments, the sidewalls $SW_{400}$ of the wiring substrate 400 are aligned with the reinforcement vias 304 along the direction D1. As illustrated in FIG. 2, the topmost reinforcement pattern layer 302 includes a mesh pattern. For example, the topmost reinforcement pattern layer 302 includes a plurality of through holes exposing the underlying dielectric layer 102 (i.e. the topmost dielectric layer 102). In some embodiments, at least a portion of the mesh pattern of the topmost reinforcement pattern layer 302 is located within a scribe line region SR where a dicing process may be performed later. The mesh pattern is able to reduce the difficulty in cutting through the metal pattern during the subsequently dicing process. In some embodiments, other than the topmost reinforcement pattern layer 302, other reinforcement pattern layers 302 also include mesh patterns located within the scribe line region SR.

Figure 1C:
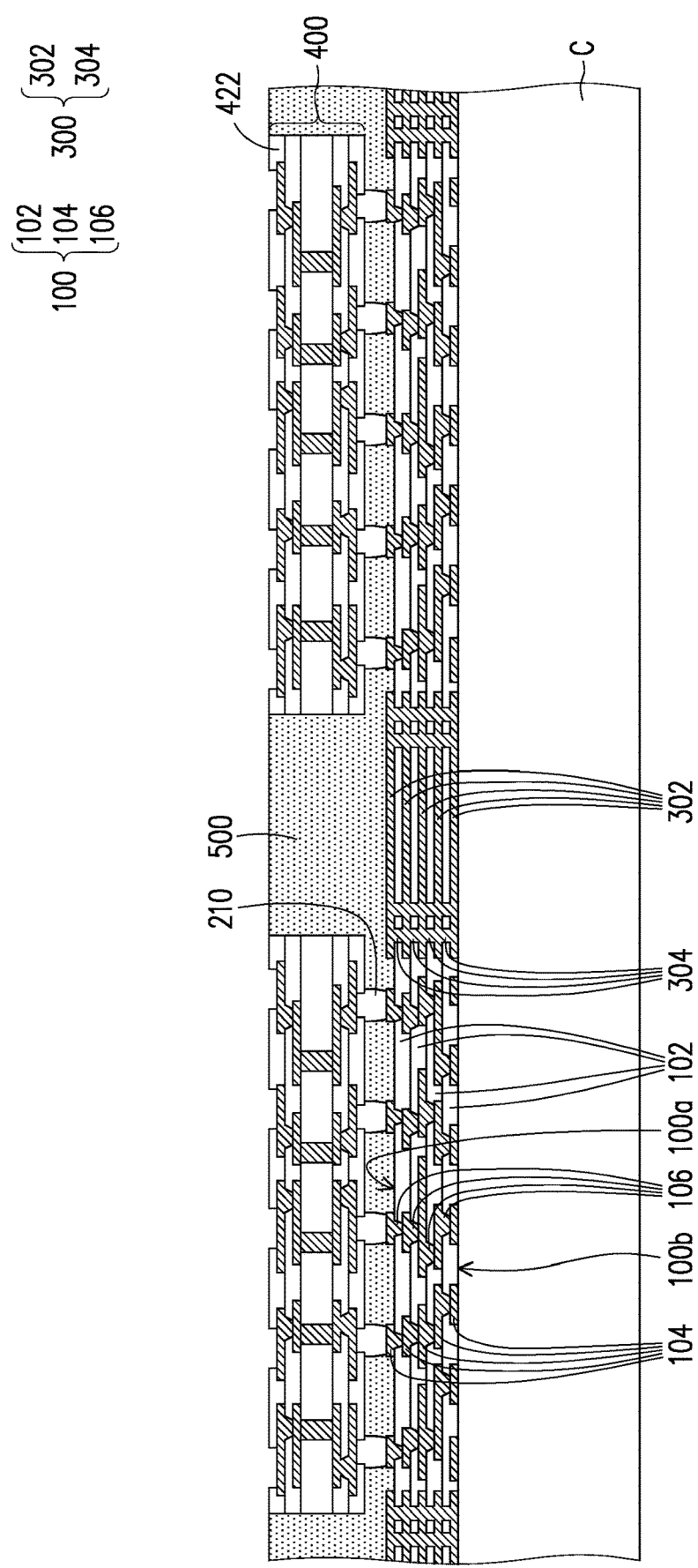

Referring to FIG. 1C, an insulating encapsulation 500 is formed over the redistribution circuit structure 100 and the reinforcement structures 300 to laterally encapsulate the wiring substrates 400. In some embodiments, the insulating encapsulation 500 fills in the space between the wiring substrates 400 and the redistribution circuit structure 100 to encapsulate the conductive terminals 210. For example, the conductive terminals 210 are embedded in the insulating encapsulation 500 and are well protected by the insulating encapsulation 500. In some embodiments, the insulating encapsulation 500 also fills in the space between the wiring substrates 400 and the reinforcement structures 300. For example, the insulating encapsulation 500 encapsulates the topmost reinforcement pattern layer 302. That is, the reinforcement structures 300 are directly in contact with the insulating encapsulation 500. In some embodiments, the insulating encapsulation 500 is formed such that a top surface of the insulating encapsulation 500 is substantially coplanar with a top surface of the topmost dielectric layer 424 of each wiring substrate 400. In some embodiments, a material of the insulating encapsulation 500 includes a molding compound, an epoxy, an underfill, a molding underfill (MUF), a resin, or the like. In some embodiments, the insulating encapsulation 500 is formed by a molding process, an injection process, a combination thereof, or the like. The molding process includes, for example, a transfer molding process, a compression molding process, or the like. In some embodiments, the insulating encapsulation 500 may be cured after placement.

Figure 1D:
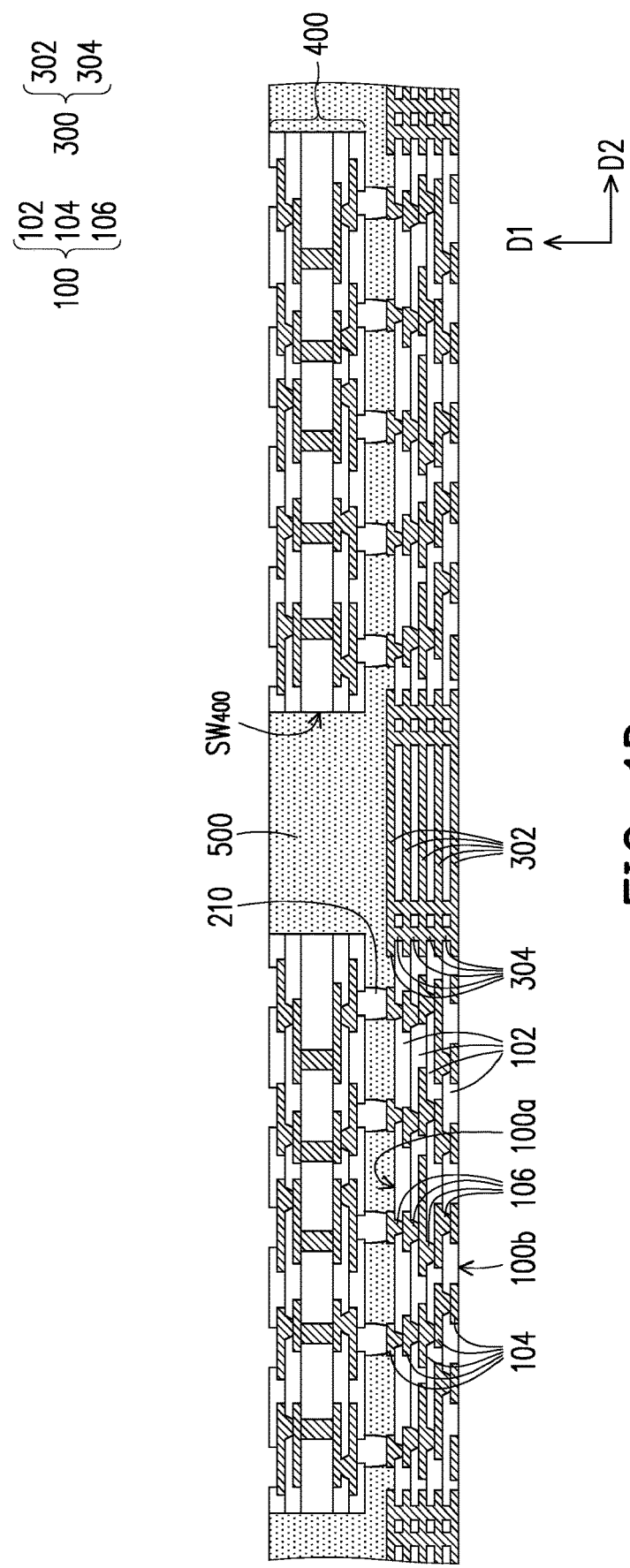

Referring to FIG. 1C and FIG. 1D, a de-bonding process is performed to remove the carrier C. That is, the redistribution circuit structure 100 is de-bonded from the carrier C such that the second surface 100b of the redistribution circuit structure 100 is exposed. In some embodiments, the carrier C may be de-bonded from the redistribution circuit structure 100 through a thermal process to alter the adhesive properties of the adhesive layer (not shown) disposed between the carrier C and the redistribution circuit structure 100. In some embodiments, an energy source such as an ultraviolet (UV) laser, a carbon dioxide ($CO_2$) laser, or an infrared (IR) laser, is utilized to irradiate and heat the adhesive layer until the adhesive layer loses at least some of its adhesive properties. Once being irradiated by the energy source, the carrier C and the adhesive layer may be physically separated and removed from the redistribution circuit structure 100.

In general, the dielectric layers 102 and the conductive pattern layers 104 in the redistribution circuit structure 100 are subjected to crack and delamination after de-bonding from the carrier C due to severe bending stress during the de-bonding process. The crack and delamination tend to occur underneath edges of the wiring substrates 400. However, as mentioned above, the sidewalls $SW_{400}$ of the wiring substrates 400 are overlapped with the reinforcement structures 300 along the direction D1 perpendicular to the first surface 100a of the redistribution circuit structure 100. That is, the reinforcement structures 300 are directly underneath the edges (i.e. the sidewalls $SW_{400}$) of the wiring substrates 400. In other words, the reinforcement structures 300 are located at locations where the crack and the delamination are likely to occur. Therefore, the reinforcement structures 300 may serve as blocking mechanisms for the crack and delamination. For example, the reinforcement structures 300 are able to enhance the structure rigidity against bending stress generated. As such, with the presence of the reinforcement structures 300, the crack and/or delamination issue in the redistribution circuit structure 100 may be alleviated, thereby enhancing the yield and reliability of the subsequently formed package structure 10.

Figure 1E:
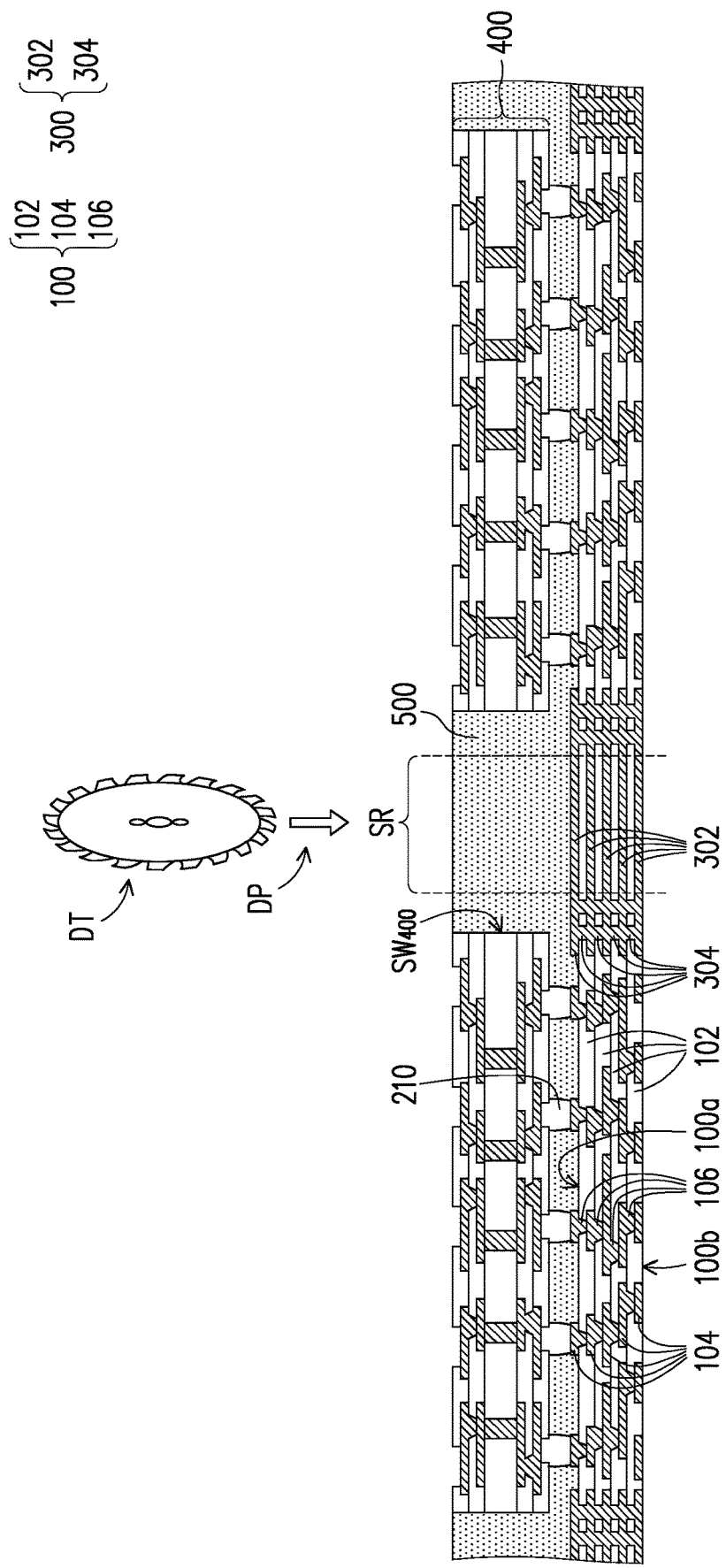

Referring to FIG. 1E, a dicing process DP is performed on the scribe line region SR. In some embodiments, the dicing process DP includes a pre-cut process and a singulation process. The dicing process DP may be performed using any suitable dicing tool DT, such as a blade, a saw, a laser drill, an etching process, a combination thereof, or the like. For example, the dicing process DP typically involves dicing with a rotating blade or a laser beam. In other words, the dicing process DP is, for example, a laser cutting process, a mechanical cutting process, or other suitable processes. In some embodiments, during the dicing process DP, stress may be generated at the regions near the scribe line region SR, thereby causing cracks in the redistribution circuit structure 100. However, since the reinforcement structures 300 are partially located within the scribe line region SR, the reinforcement structures 300 are able to enhance the structure rigidity against stress generated. As such, with the presence of the reinforcement structures 300, the crack issue in the redistribution circuit structure 100 derived from the dicing process DP may be alleviated, thereby enhancing the yield and reliability of the subsequently formed package structure 10.

Figure 1F:
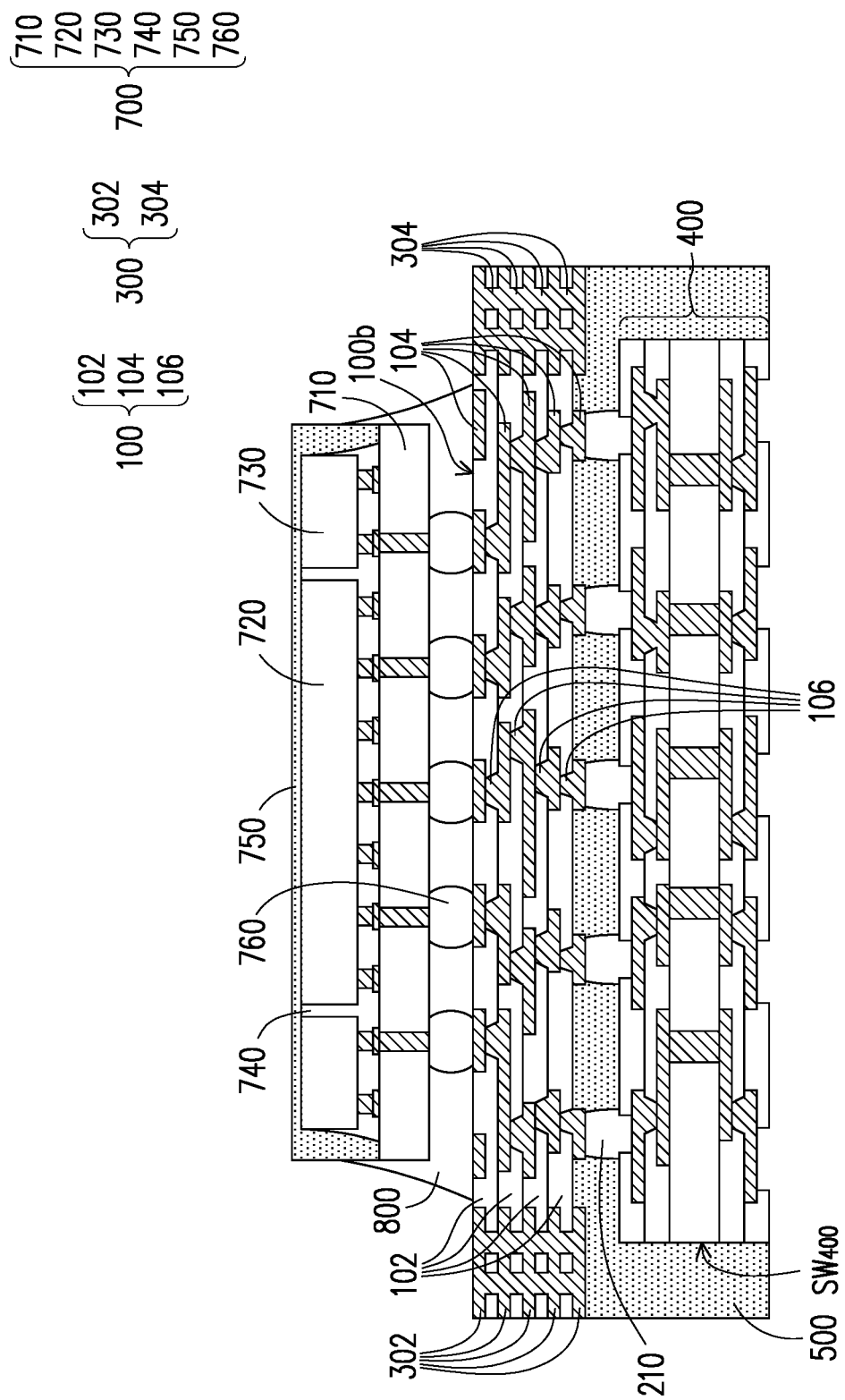

Referring to FIG. 1F, the singulated structure is attached to a temporary substrate (not shown), such as a tape, wafer, panel, frame, ring, or the like for further processing. Thereafter, a semiconductor device 700 is mounted on the second surface 100b of the redistribution circuit structure 100. For example, the semiconductor device 700 is mounted on the redistribution circuit structure 100 opposite to the wiring substrates 400. In some embodiments, the semiconductor device 700 is mounted on the redistribution circuit structure 100 such that the semiconductor device 700 is electrically connected to the topmost conductive pattern layer 104 of the redistribution circuit structure 100 shown in FIG. 1F. In some embodiments, the semiconductor device 700 may be a chip package including an interposer 710, a semiconductor die 720, memory cubes 730, an underfill 740, an insulating encapsulation 750, and conductive terminals 760. The semiconductor die 720 and the memory cubes 730 are disposed on and electrically connected to the interposer 710. The underfill 740 fills the space between the interposer 710 and the semiconductor die 720 as well as the space between the interposer 710 and the memory cubes 730. The insulating encapsulation 750 encapsulates the semiconductor die 720, the memory cubes 730, and the underfill 740. The conductive terminals 760 are disposed on a bottom surface of the interposer 710. The semiconductor device 700 is electrically connected to the redistribution circuit structure 100 through the conductive terminals 760.

In some embodiments, the interposer 710 is a semiconductor interposer (e.g., a silicon interposer) including through semiconductor vias (e.g. through silicon vias). The semiconductor die 720 may be logic die, a system on chip (SOC) die, or other suitable semiconductor dies. The memory cubes 730 may include high bandwidth memory (HBM) cubes or other suitable memory devices. In some embodiments, a material of the underfill 740 is an insulating material and may include a resin (e.g., epoxy resin), a filler material, a stress release agent (SRA), an adhesion promoter, other material, or a combination thereof. In some embodiments, the insulating encapsulation 750 includes molding compound, molding underfill (MUF), epoxy resins, phenolic hardeners, silicas, catalysts, pigments, mold release agents, a combination thereof, or the like. In some embodiments, the conductive terminals 760 include ball-grid array (BGA) balls.

As illustrated in FIG. 1F, once the semiconductor device 700 has been mounted on the redistribution circuit structure 100, an underfill 800 is formed to fill the gap between the semiconductor device 700 and the redistribution circuit structure 100. In some embodiments, the conductive terminals 760 are encapsulated by the underfill 800. In other words, the conductive terminals 760 are being well protected by the underfill 800. In some embodiments, the underfill 800 also partially covers sidewalls of the semiconductor device 700. In some embodiments, a material of the underfill 800 includes molding compound, epoxy, molding underfill (MUF), a resin, or the like.

Figure 1G:
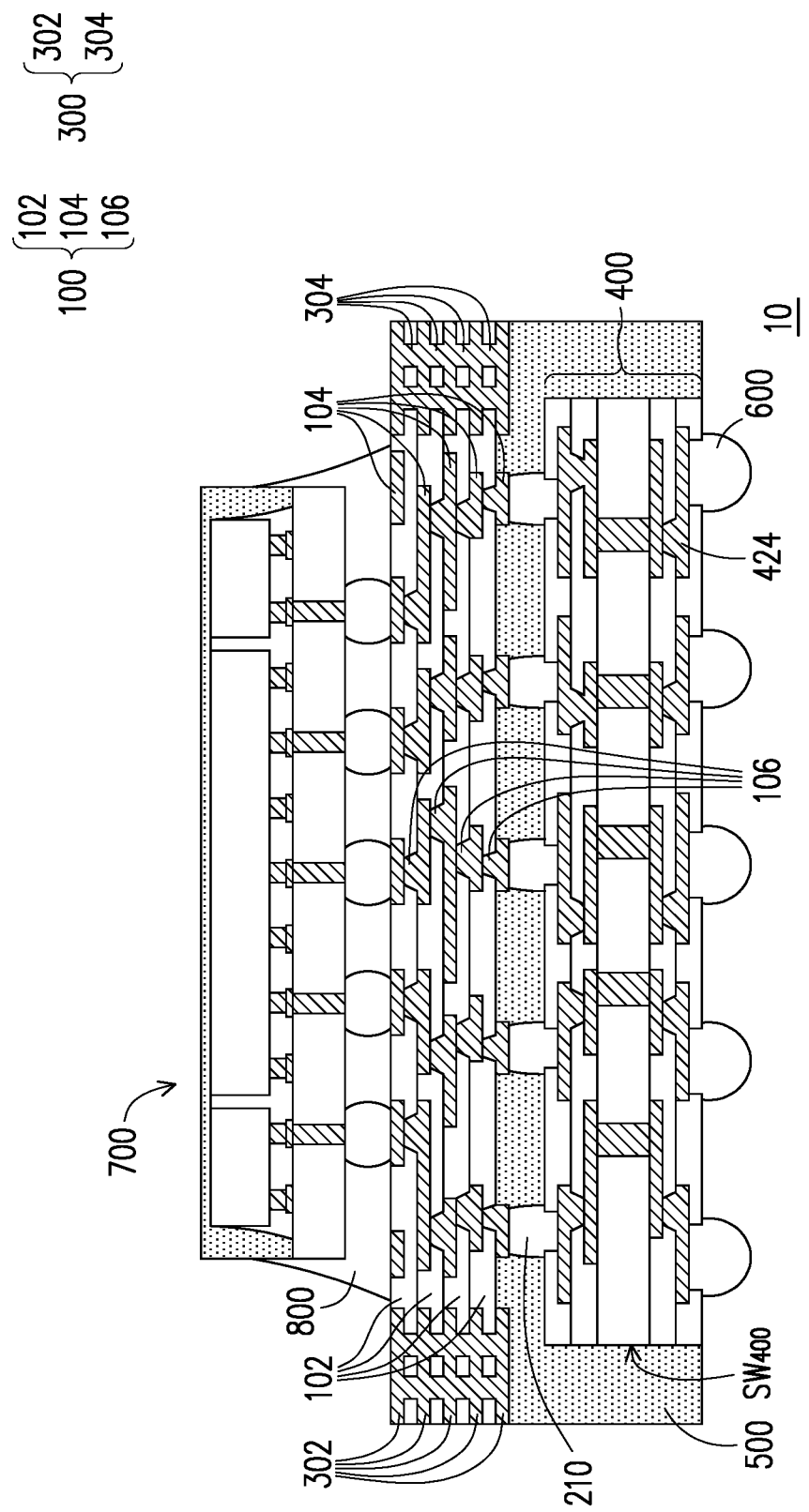

Referring to FIG. 1G, a plurality of conductive terminals 600 is formed over the wiring substrates 400 to obtain a package structure 10. In some embodiments, the conductive terminals 600 are formed over the bottommost conductive pattern layer 424. In some embodiments, the conductive terminals 600 are attached to the bottommost conductive pattern layer 424 through a solder flux. In some embodiments, the conductive terminals 600 are ball grid array (BGA) connectors, solder balls, metal pillars, and/or the like. In some embodiments, the conductive terminals 600 may be disposed on the wiring substrates 400 through a ball placement process and/or a reflow process.

It should be noted that the configuration of the reinforcement structure 300 of the package structure 10 shown in FIG. 1G and FIG. 2 is merely an exemplary illustration, and the disclosure is not limited thereto. In some alternative embodiments, the reinforcement structure 300 may be arranged differently. For example, other configuration of the reinforcement structure will be discussed below in conjunction with FIG. 3 and FIG. 4.

Figure 3:
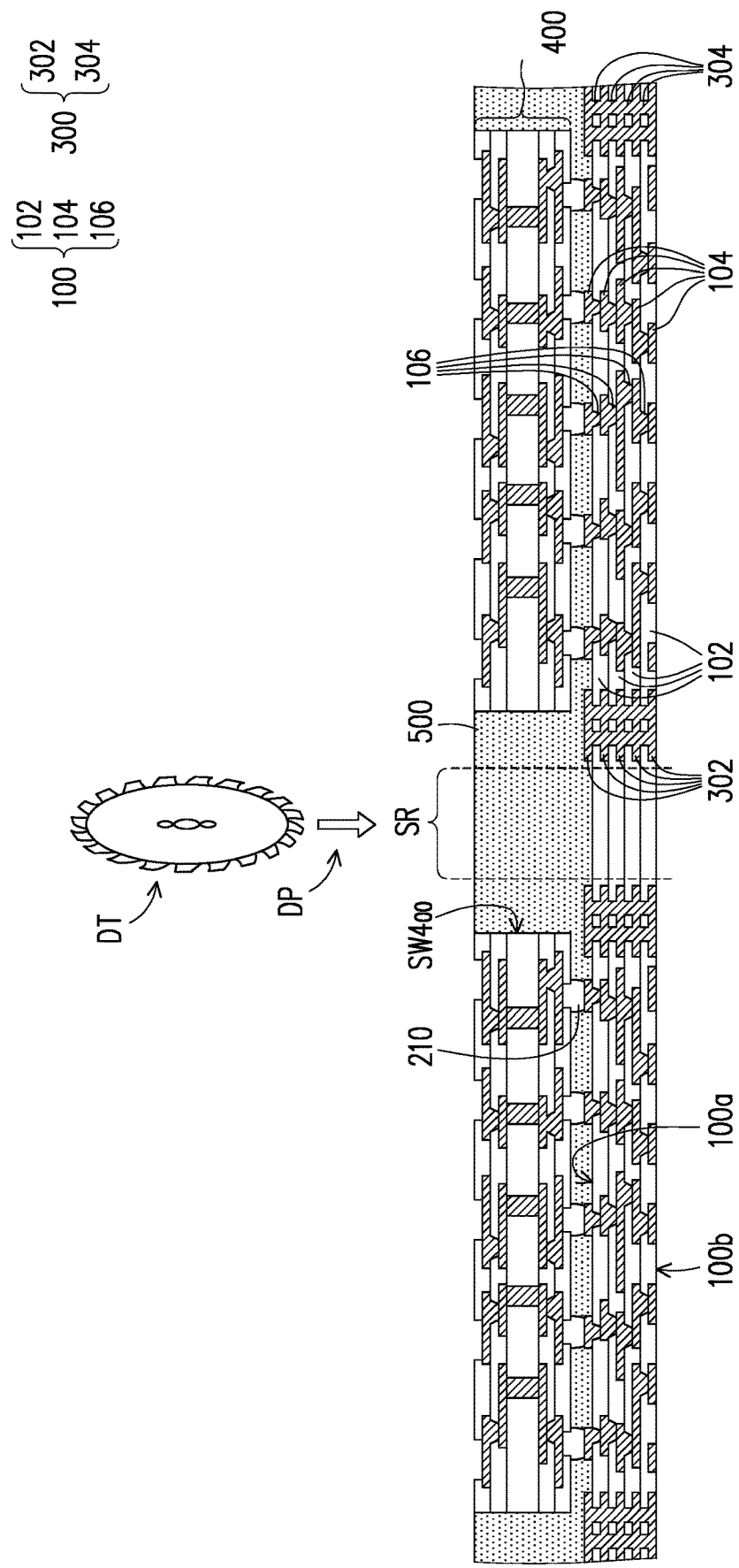
FIG. 3 is a schematic cross-sectional view illustrating an intermediate stage of a package structure in accordance with some alternative embodiments of the disclosure.
Figure 4:
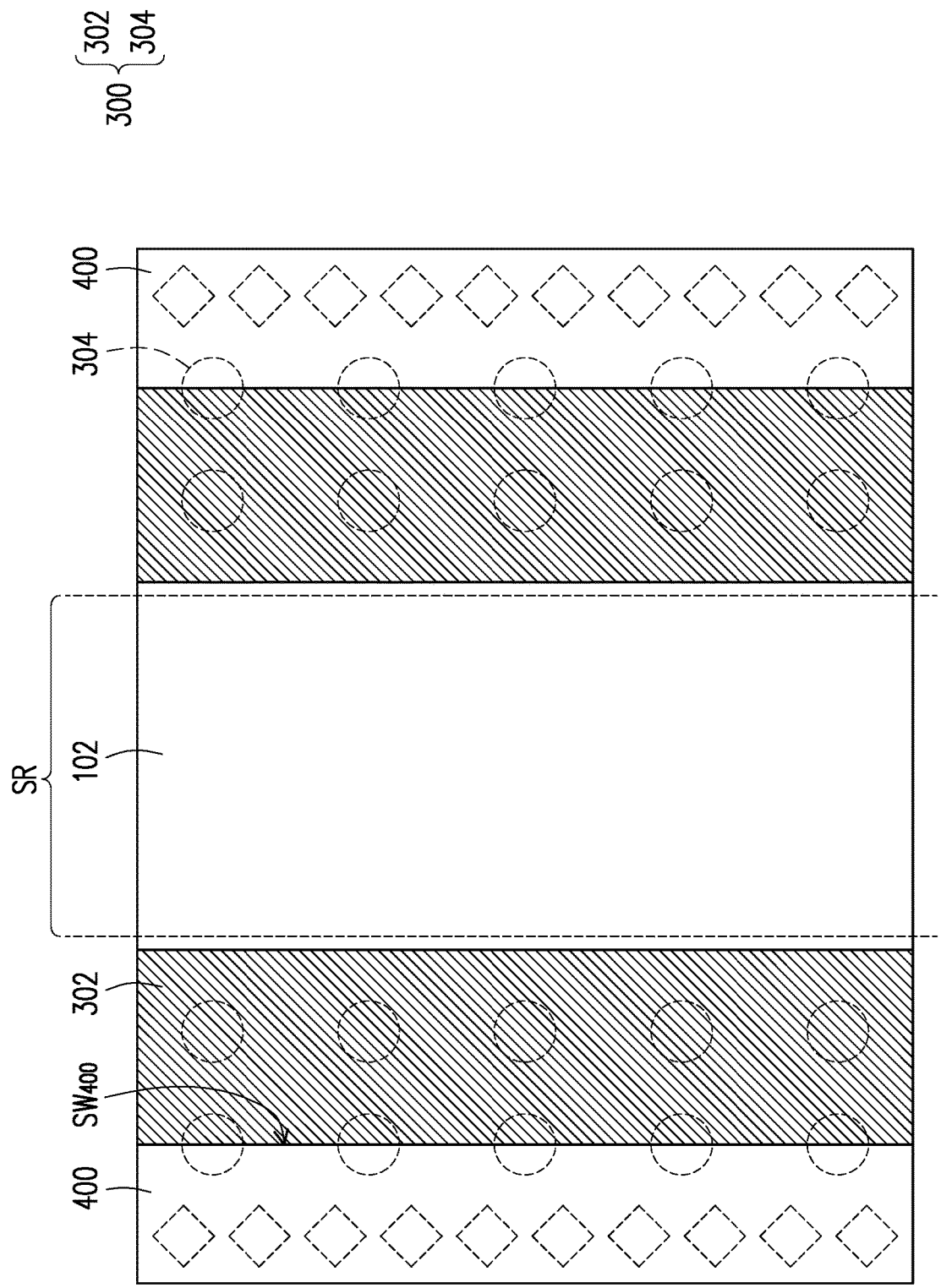
FIG. 4 is a schematic partial top view of the wiring substrate and the reinforcement structure in FIG. 3.

FIG. 3 is a schematic cross-sectional view illustrating an intermediate stage of a package structure 10 in accordance with some alternative embodiments of the disclosure. FIG. 4 is a schematic partial top view of the wiring substrate 400 and the reinforcement structure 300 in FIG. 3. Referring to FIG. 3, the structure illustrated in FIG. 3 is similar to the structure illustrated in FIG. 1E, so similar elements are denoted by the same reference numeral and the detailed descriptions thereof are omitted herein. In other words, the structure illustrated in FIG. 3 may be obtained by performing the steps similar to the steps illustrated in FIG. 1A to FIG. 1E. For simplicity, the insulating encapsulation 500 is omitted in FIG. 4. As illustrated in FIG. 3 and FIG. 4, the difference between the structure illustrated in FIG. 3 and the structure illustrated in FIG. 1E lies in that the scribe line region SR is free of reinforcement pattern layer 302 in FIG. 3. That is, the scribe line region SR is free of metal pattern. As such, the dicing process DP may be easily performed since the dicing tool DT does not require to cut through any metal pattern having higher rigidity. Similar to the reinforcement structures 300 shown in FIG. 1A to FIG. 1G, the reinforcement structures 300 shown in FIG. 3 and FIG. 4 are also able to serve as blocking mechanisms for the crack and delamination derived from the de-bonding process shown in FIG. 1C and FIG. 1D. For example, the reinforcement structures 300 are able to enhance the structure rigidity against bending stress generated. As such, with the presence of the reinforcement structures 300, the crack and/or delamination issue in the redistribution circuit structure 100 may be alleviated, thereby enhancing the yield and reliability of the package structure 10. Moreover, during the dicing process DP, stress may be generated at the regions near the scribe line region SR, thereby causing cracks in the redistribution circuit structure 100. However, since the reinforcement structures 300 are located in proximity to the scribe line region SR, the reinforcement structures 300 are able to enhance the structure rigidity against stress generated. As such, with the presence of the reinforcement structures 300, the crack issue in the redistribution circuit structure 100 derived from the dicing process DP may be alleviated, thereby enhancing the yield and reliability of the package structure 10.

Figure 5A:
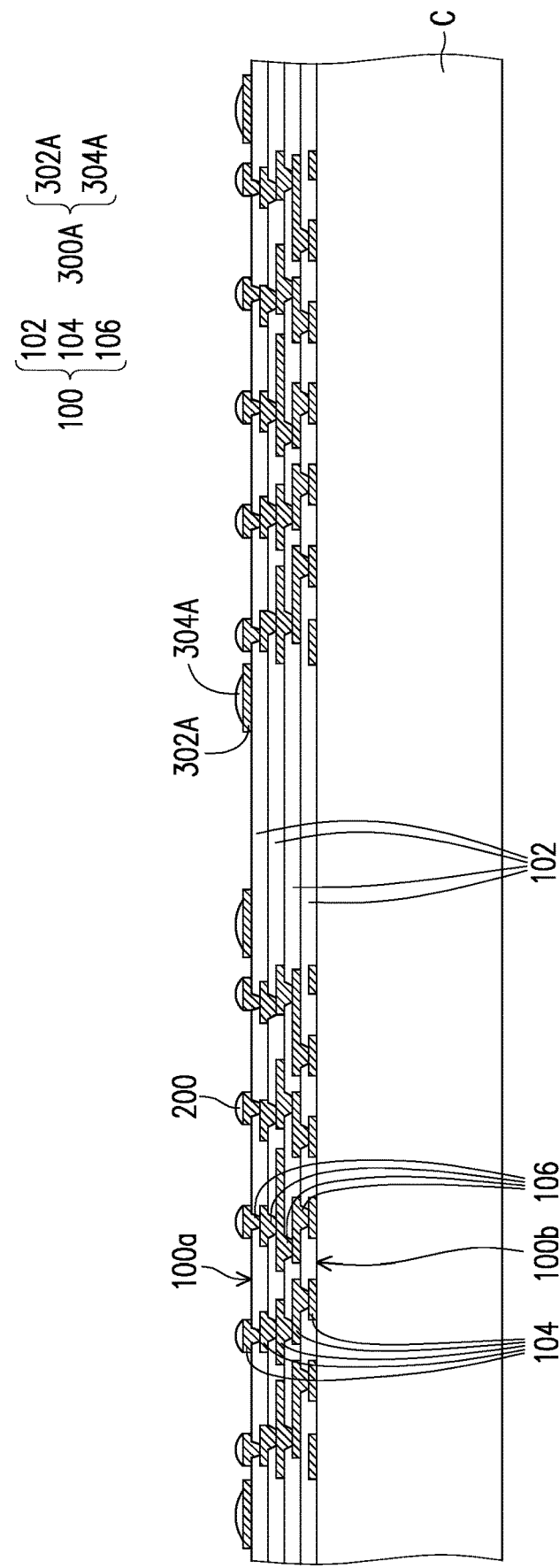
FIG. 5A to FIG. 5G are schematic cross-sectional views illustrating a manufacturing process of a package structure in accordance with some alternative embodiments of the disclosure.

FIG. 5A to FIG. 5G are schematic cross-sectional views illustrating a manufacturing process of a package structure 20 in accordance with some alternative embodiments of the disclosure. Referring to FIG. 5A, the structure illustrated in FIG. 5A is similar to the structure illustrated in FIG. 1A, so similar elements are denoted by the same reference numeral and the detailed descriptions thereof are omitted herein. The difference between the structure illustrated in FIG. 5A and the structure illustrated in FIG. 1A lies in that the reinforcement structures 300 in FIG. 1A are replaced by reinforcement structures 300A in FIG. 5A. As illustrated in FIG. 5A, the reinforcement structures 300A are disposed on the first surface 100a of the redistribution circuit structure 100. In some embodiments, each reinforcement structure 300A includes a reinforcement pattern layer 302A and a plurality of reinforcement bumps 304A disposed on the reinforcement pattern layer 302A. In some embodiments, the reinforcement bumps 304A do not completely cover the reinforcement pattern layer 302A. For example, at least a portion of a top surface of the reinforcement pattern layer 302A is exposed.

In some embodiments, the topmost conductive pattern layer 104 of the redistribution circuit structure 100 and the reinforcement pattern layer 302A of the reinforcement structure 300A are simultaneously formed. For example, the topmost conductive pattern layer 104 and the reinforcement pattern layer 302A are located at the same level height. In some embodiments, a material of the reinforcement pattern layer 302A includes aluminum, titanium, copper, nickel, tungsten, or alloys thereof. The reinforcement pattern layer 302A may be formed by electroplating, deposition, and/or photolithography and etching. On the other hand, the conductive coatings 200 and the reinforcement bumps 304A of the reinforcement structure 300A are simultaneously formed. For example, the conductive coatings 200 and the reinforcement bumps 304A are located at the same level height. In other words, the conductive coatings 200 and at least a portion of the reinforcement structure 300A are simultaneously formed. In some embodiments, the reinforcement bumps 304A include solder material. In some embodiments, the reinforcement bumps 304A are formed through a printing process of pre-solder material. Since the topmost conductive pattern layer 104 and the reinforcement pattern layer 302A can be formed through the same process and the conductive coatings 200 and the reinforcement bumps 304A can be formed through the same process, formation of the reinforcement structures 300A is compatible with current process and does not increase additional fabrication cost.

Figure 5B:
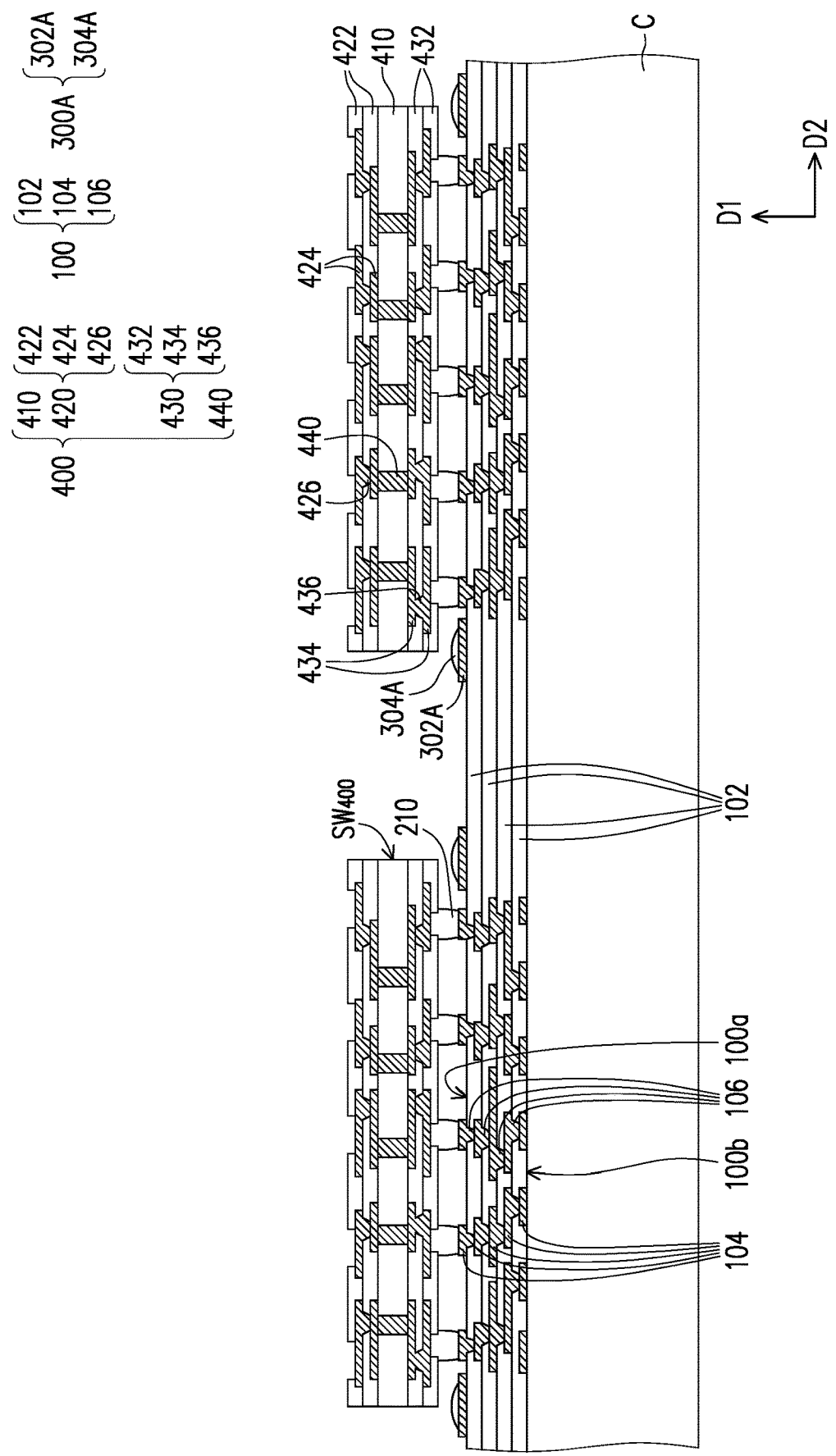

Referring to FIG. 5B, a plurality of wiring substrates 400 is mounted on the first surface 100a of the redistribution circuit structure 100. The wiring substrates 400 in FIG. 5B are similar to the wiring substrates 400 in FIG. 1B, so the detailed descriptions thereof are omitted herein. As illustrated in FIG. 5B, after the wiring substrates 400 are mounted on the first surface 100a of the redistribution circuit structure 100, the reinforcement structures 300A are spaced apart from the wiring substrates 400. Moreover, the reinforcement structures 300A are located between the redistribution circuit structure 100 and the wiring substrates 400. The relative configuration of the wiring substrate 400 and the reinforcement structure 300A will be described below in conjunction with FIG. 6A and FIG. 6B.

Figure 6A:
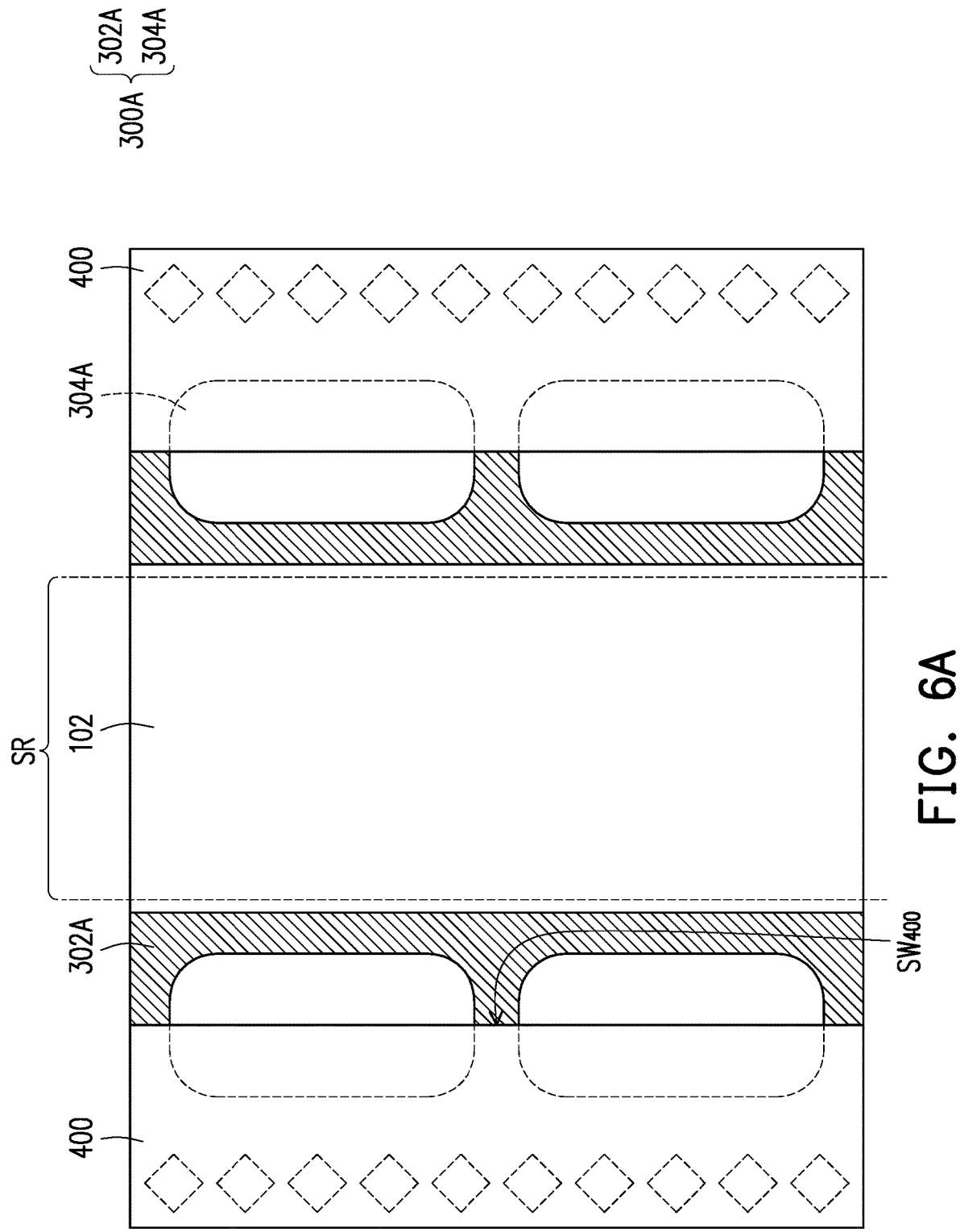
FIG. 6A is a schematic partial top view of the wiring substrate and the reinforcement structure in FIG. 5B.

FIG. 6A is a schematic partial top view of the wiring substrate 400 and the reinforcement structure 300A in FIG. 5B. Referring to FIG. 5B and FIG. 6A, sidewalls $SW_{400}$ of the wiring substrates 400 are overlapped with the reinforcement structures 300A along a direction D1 perpendicular to the first surface 100a of the redistribution circuit structure 100. For example, when the first surface 100a of the redistribution circuit structure 100 extends along a direction D2, a vertical projection of the wiring substrate 400 onto the reinforcement structure 300A along the direction D1 is partially overlapped with the reinforcement structure 300A. That is, the reinforcement structure 300A is overlapped with a peripheral region of the wiring substrate 400. In some embodiments, the sidewalls $SW_{400}$ of the wiring substrates 400 are aligned with the reinforcement bumps 304A along the direction D1. As illustrated in FIG. 6A, the scribe line region SR is free of metal pattern. As such, the subsequent dicing process may be easily performed since the dicing tool does not require to cut through any metal pattern having higher rigidity. As illustrated in FIG. 6A, the reinforcement bumps 304A are shown as rectangular bumps from the top view. However, the disclosure is not limited thereto. In some alternative embodiments, the reinforcement bumps 304A may take other shapes.

Figure 6B:
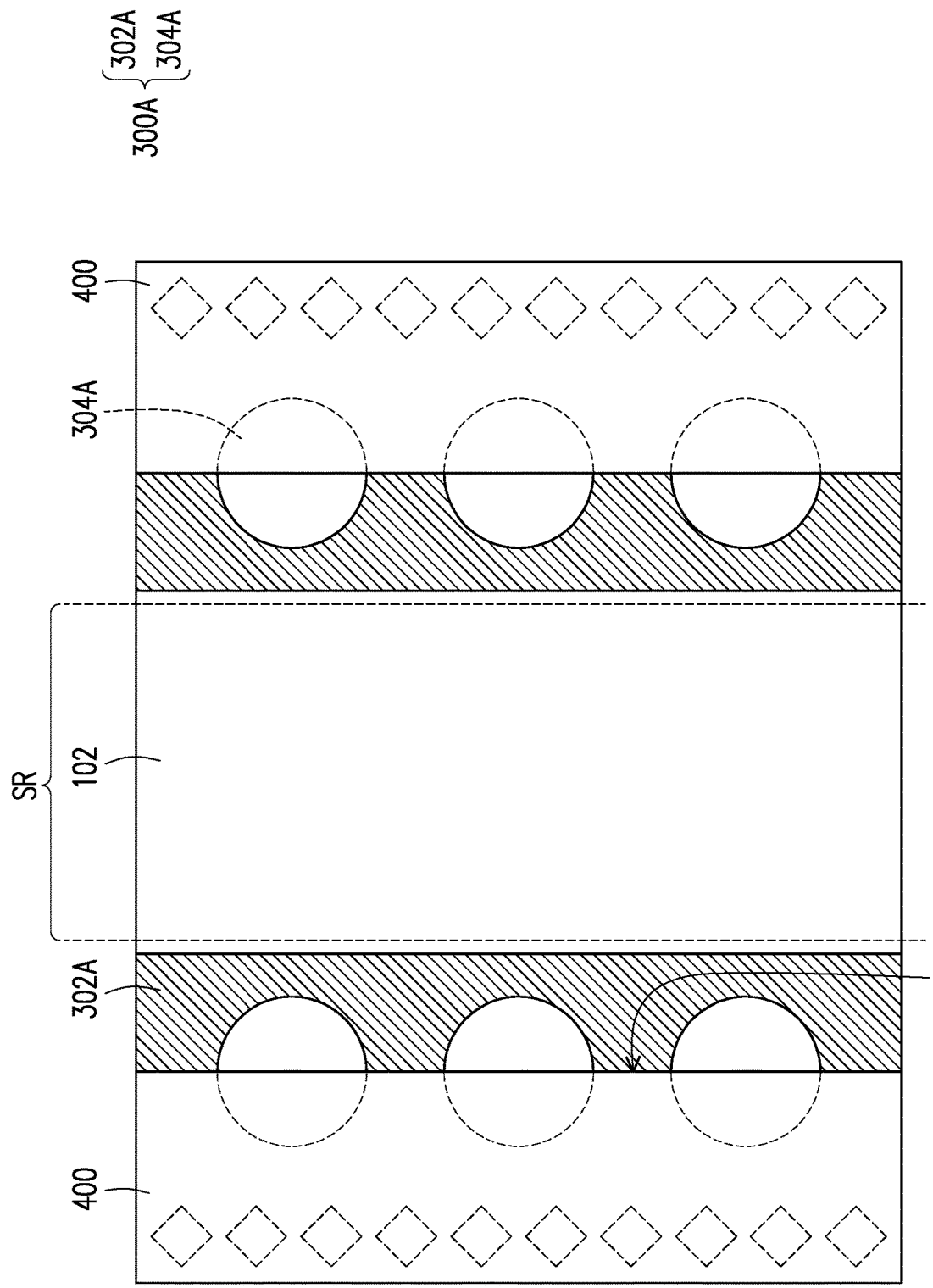
FIG. 6B is a schematic partial top view of the wiring substrate and the reinforcement structure in FIG. 5B in accordance with some alternative embodiments of the disclosure.

FIG. 6B is a schematic partial top view of the wiring substrate 400 and the reinforcement structure 300 in FIG. 5B in accordance with some alternative embodiments of the disclosure. As illustrated in FIG. 6B, the reinforcement bumps 304A are shown as circular bumps from the top view.

Figure 5C:
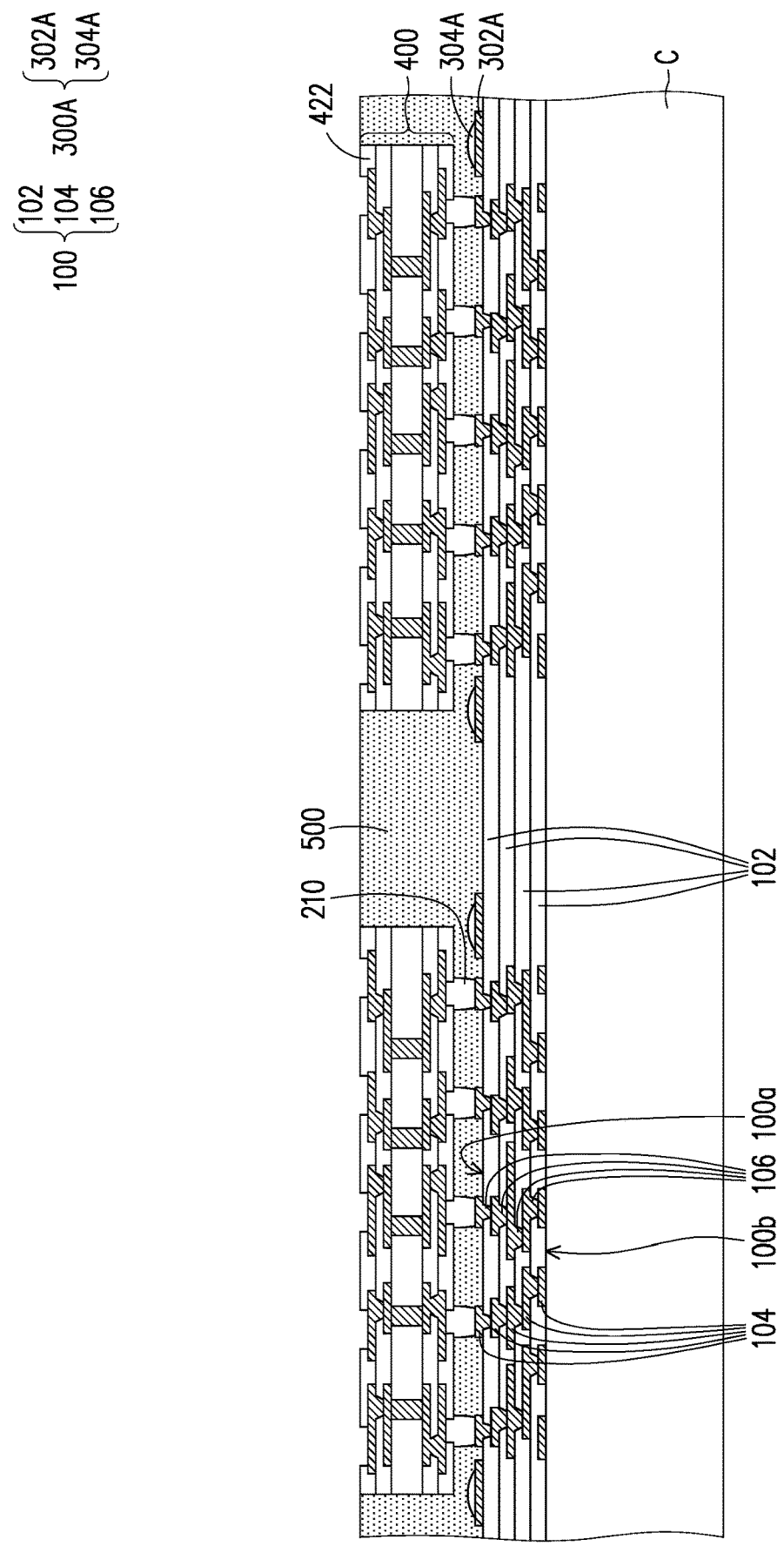
Figure 5D:
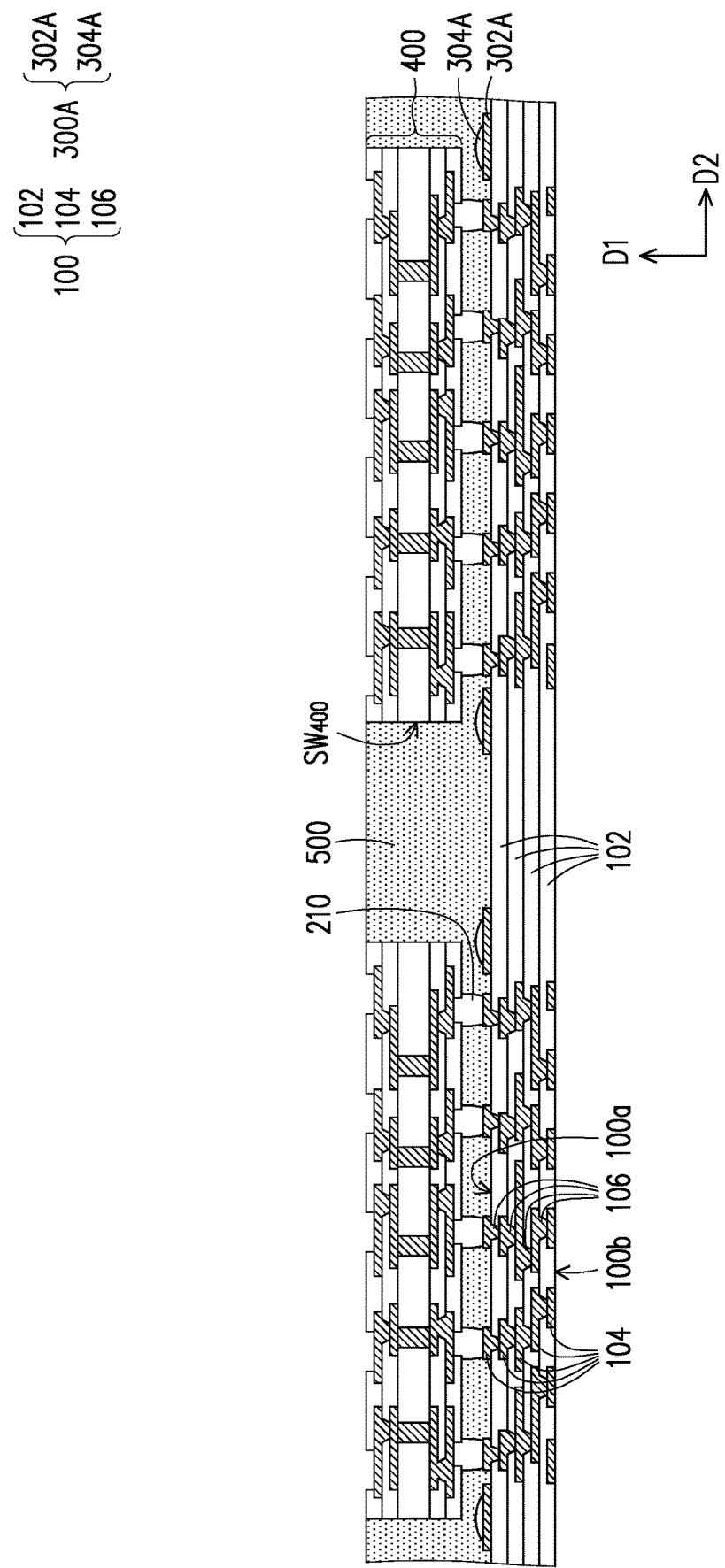

Referring to FIG. 5C to FIG. 5D, the steps illustrated in FIG. 5C to FIG. 5D are similar to the steps illustrated in FIG. 1C to FIG. 1D, so similar elements are denoted by the same reference numeral and the detailed descriptions thereof are omitted herein. As illustrated in FIG. 5C, the reinforcement structures 300A are in direct contact with the insulating encapsulation 500. For example, the insulating encapsulation 500 is in direct contact with each reinforcement pattern layer 302A and each reinforcement bump 304A such that the reinforcement structures 300A are embedded in the insulating encapsulation 500. As illustrated in FIG. 5C and FIG. 5D, the redistribution circuit structure 100 is de-bonded from the carrier C such that the second surface 100b of the redistribution circuit structure 100 is exposed.

In general, the dielectric layers 102 and the conductive pattern layers 104 in the redistribution circuit structure 100 are subjected to crack and delamination after de-bonding from the carrier C due to severe bending stress during the de-bonding process. The crack and delamination tend to occur underneath edges of the wiring substrates 400. However, as mentioned above, the sidewalls $SW_{400}$ of the wiring substrates 400 are overlapped with the reinforcement structures 300A along the direction D1 perpendicular to the first surface 100a of the redistribution circuit structure 100. That is, the reinforcement structures 300A are directly underneath the edges (i.e. the sidewalls $SW_{400}$) of the wiring substrates 400. In other words, the reinforcement structures 300A are located at locations where the crack and the delamination are likely to occur. Therefore, the reinforcement structures 300A may serve as blocking mechanisms for the crack and delamination. For example, the reinforcement structures 300A are able to enhance the structure rigidity against bending stress generated. As such, with the presence of the reinforcement structures 300A, the crack and/or delamination issue in the redistribution circuit structure 100 may be alleviated, thereby enhancing the yield and reliability of the subsequently formed package structure 20.

Figure 5E:
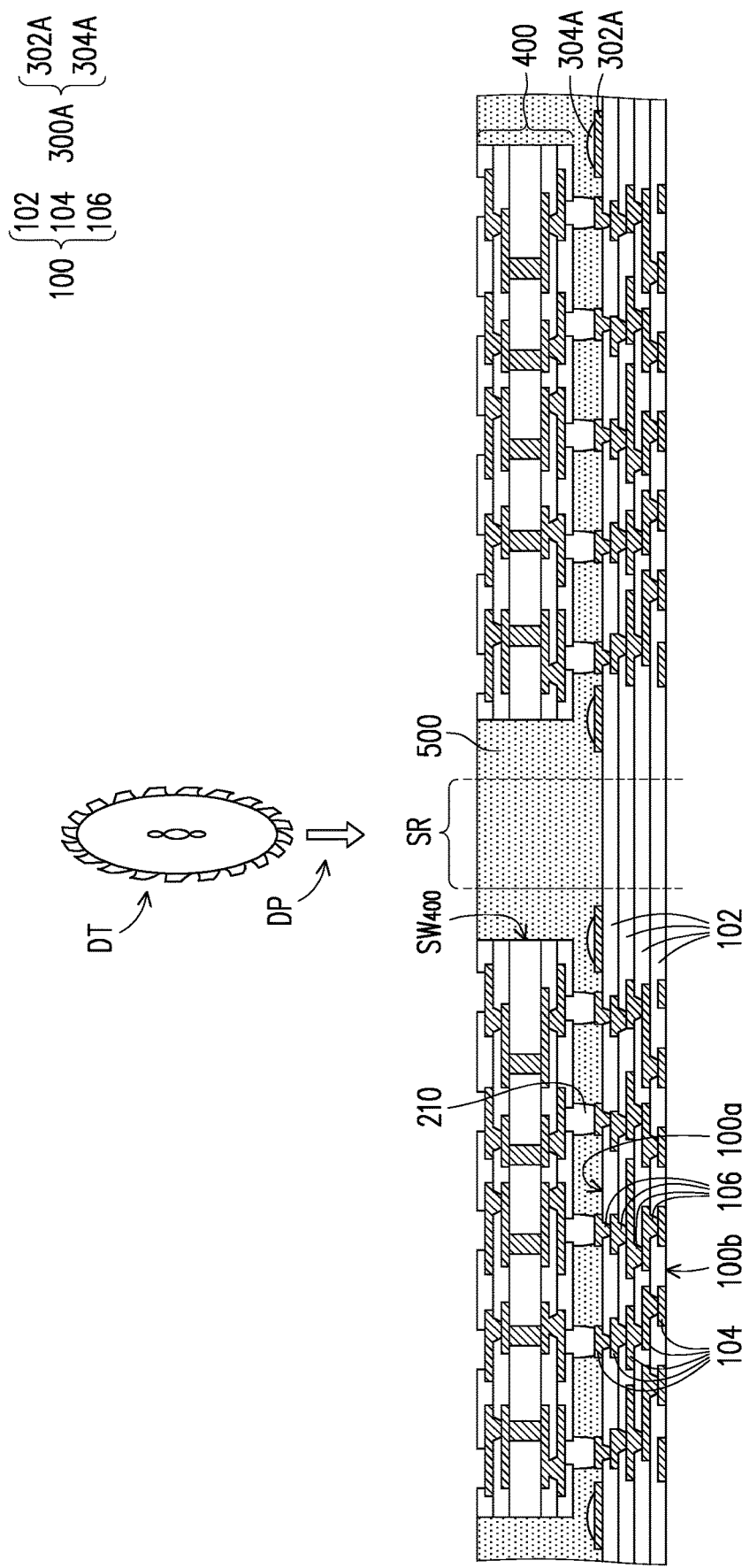
Figure 5F:
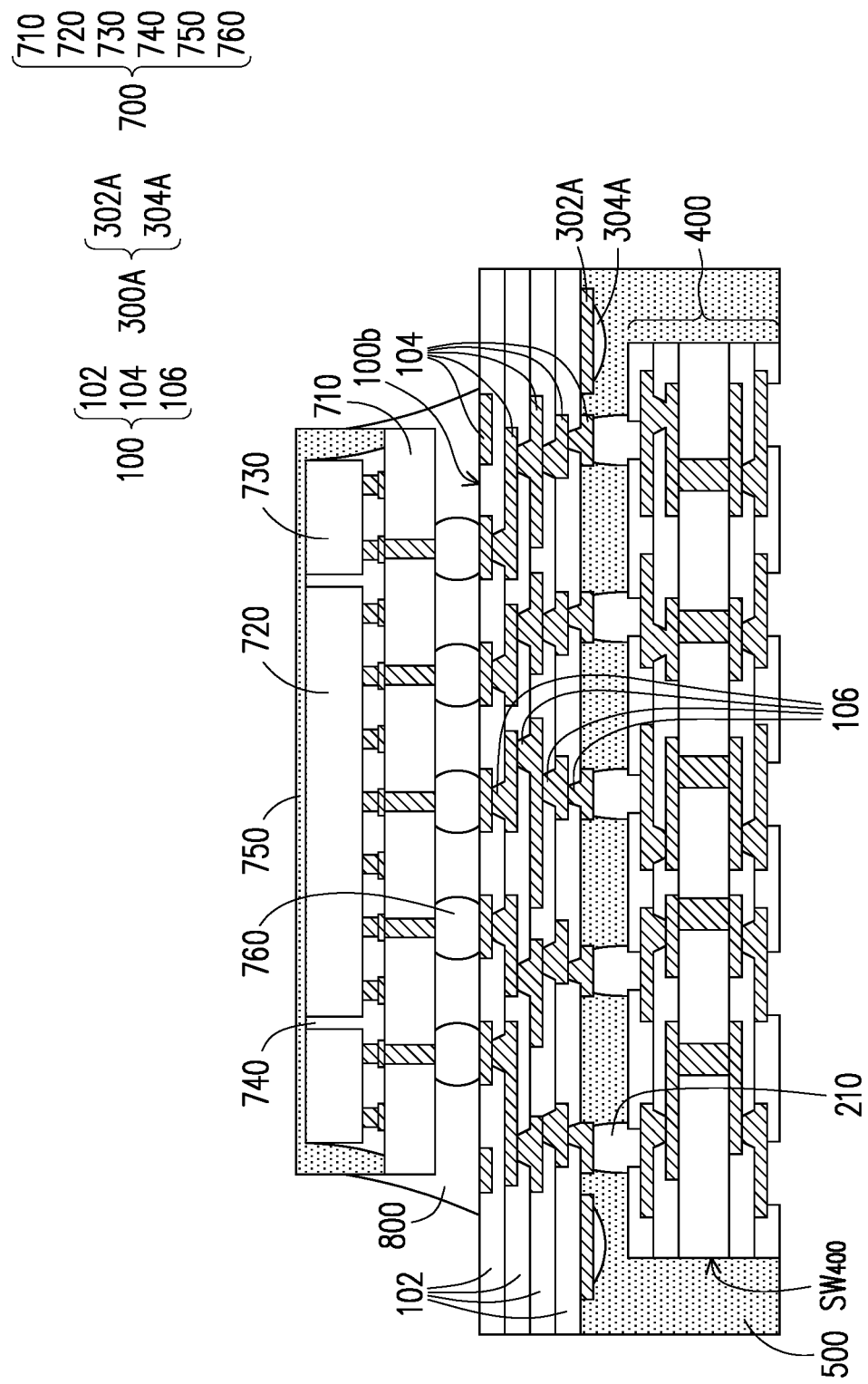
Figure 5G:
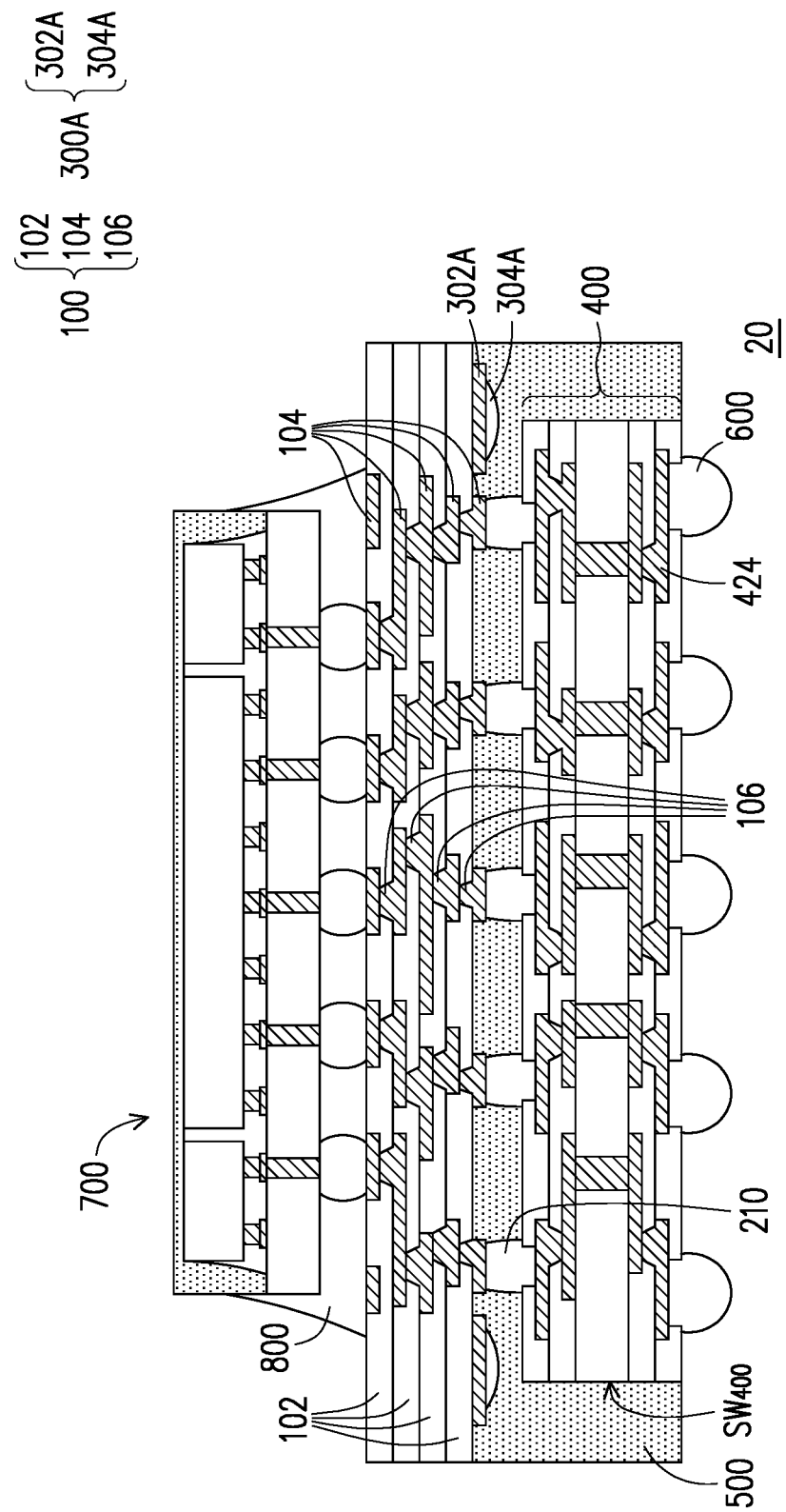

Referring to FIG. 5E to FIG. 5G, a package structure 20 is obtained. The steps illustrated in FIG. 5E to FIG. 5G are similar to the steps illustrated in FIG. 1E to FIG. 1G, so similar elements are denoted by the same reference numeral and the detailed descriptions thereof are omitted herein. As illustrated in FIG. 5E, a dicing process DP is performed on the scribe line region SR. In some embodiments, during the dicing process DP, stress may be generated at the regions near the scribe line region SR, thereby causing cracks in the redistribution circuit structure 100. However, since the reinforcement structures 300A are located in proximity to the scribe line region SR, the reinforcement structures 300A are able to enhance the structure rigidity against stress generated. As such, with the presence of the reinforcement structures 300A, the crack issue in the redistribution circuit structure 100 derived from the dicing process DP may be alleviated, thereby enhancing the yield and reliability of the package structure 20.

Other configuration of the reinforcement structures will be discussed below in conjunction with FIG. 7 to FIG. 14.

FIG. 7 to FIG. 14 are schematic cross-sectional views illustrating package structures in accordance with various embodiments of the disclosure.

Figure 7:
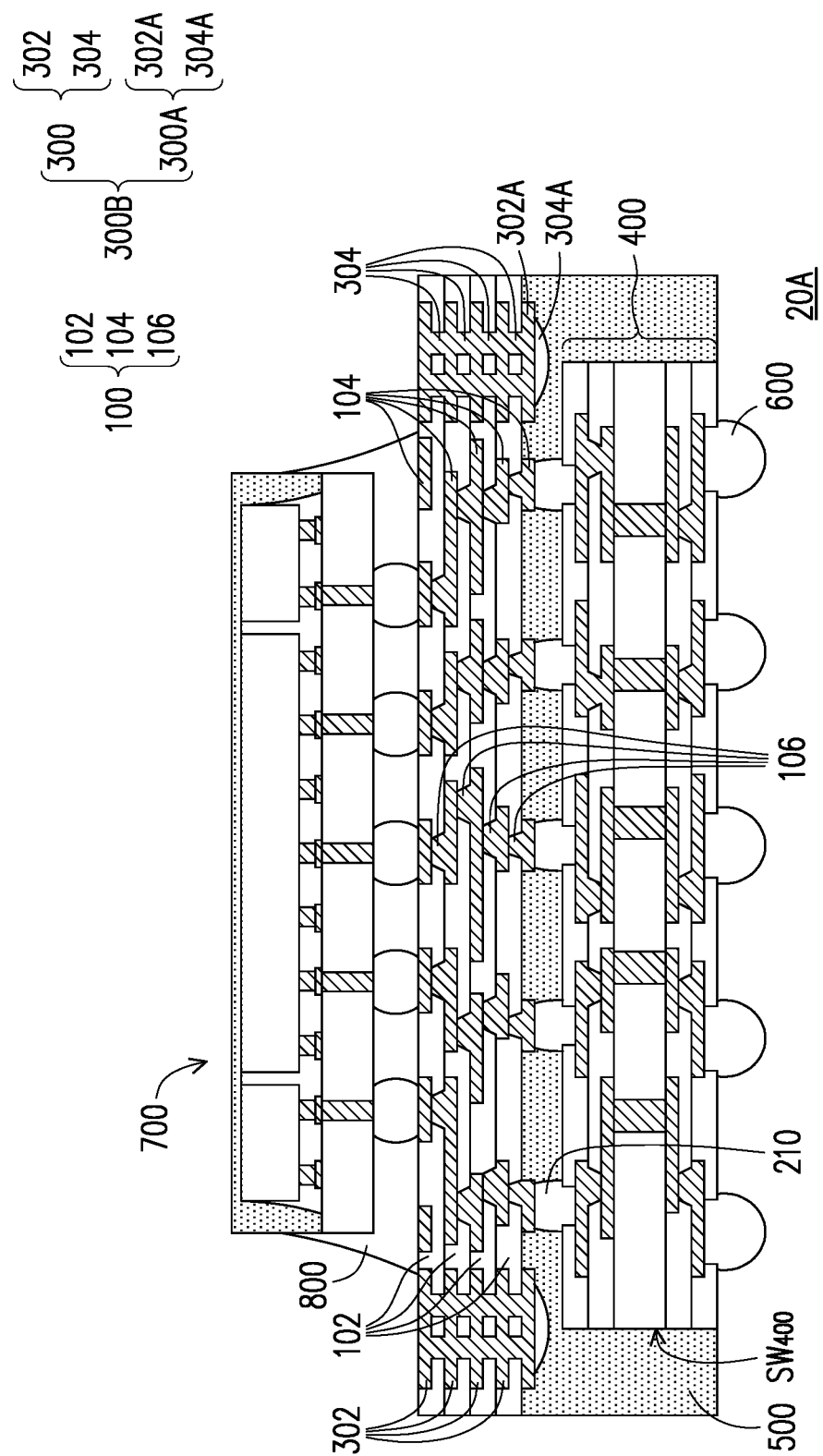
FIG. 7 to FIG. 14 are schematic cross-sectional views illustrating package structures in accordance with various embodiments of the disclosure.

Referring to FIG. 7, a package structure 20A is shown. The package structure 20A in FIG. 7 is similar to the package structure 20 in FIG. 5G, so similar elements are denoted by the same reference numeral and the detailed descriptions thereof are omitted herein. The difference between the package structure 20A illustrated in FIG. 7 and the package structure 20 illustrated in FIG. 5G lies in that the reinforcement structure 300A in FIG. 5G is replaced by a reinforcement structure 300B in FIG. 7. As illustrated in FIG. 7, the reinforcement structure 300B is a combination of a reinforcement structure 300 and a reinforcement structure 300A. The reinforcement structure 300 in FIG. 7 is similar to the reinforcement structure 300 in FIG. 1G, so the detailed description thereof is omitted herein. On the other hand, the reinforcement structure 300A in FIG. 7 is similar to the reinforcement structure 300A in FIG. 5G, so the detailed description thereof is omitted herein. Similar to the reinforcement structure 300 in FIG. 1G and the reinforcement structure 300A in FIG. 5G, the reinforcement structure 300B may also enhance the structure rigidity against bending stress generated by the de-bonding process and cutting stress generated by the dicing process. As such, with the presence of the reinforcement structure 300B, the crack and/or delamination issue in the redistribution circuit structure 100 may be alleviated, thereby enhancing the yield and reliability of the package structure 20A.

Figure 8:
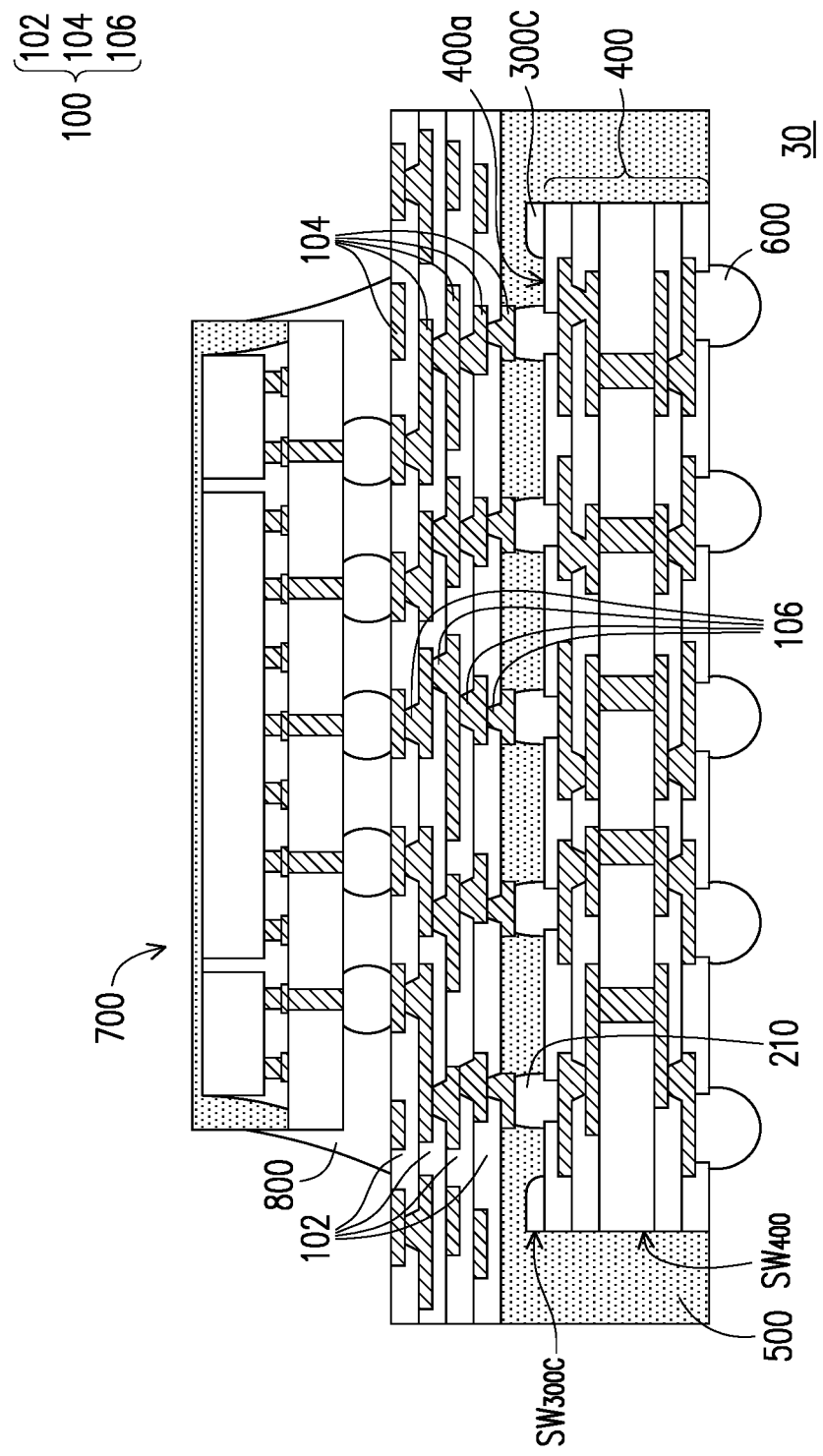

Referring to FIG. 8, a package structure 30 is shown. The package structure 30 in FIG. 8 is similar to the package structure 10 in FIG. 1G, so similar elements are denoted by the same reference numeral and the detailed descriptions thereof are omitted herein. The difference between the package structure 30 illustrated in FIG. 8 and the package structure 10 illustrated in FIG. 1G lies in that the reinforcement structure 300 in FIG. 1G is replaced by a reinforcement structure 300C in FIG. 8. As illustrated in FIG. 8, the reinforcement structure 300C is disposed on a first surface 400a of the wiring substrate 400. In some embodiments, the reinforcement structure 300C exhibits a ring shape from a top view. In some embodiments, the ring-shaped reinforcement structure 300C extends along four edges of the first surface 400a of the wiring substrate 400. For example, sidewalls $SW_{300C}$ of the reinforcement structure 300C are aligned with sidewalls $SW_{400}$ of the wiring substrate 400. As illustrated in FIG. 8, the reinforcement structure 300C is embedded in the insulating encapsulation 500. For example, the reinforcement structure 300C is in direct contact with the insulating encapsulation 500. In some embodiments, the reinforcement structure 300C is spaced apart from the redistribution circuit structure 100. For example, the reinforcement structure 300C is separated from the redistribution circuit structure 100 by the insulating encapsulation 500.

In some embodiments, the reinforcement structure 300C is made of polymeric materials. For example, a material of the reinforcement structure 300C includes polyimide, epoxy resin, acrylic resin, phenol resin, BCB, PBO, or a combination thereof. In some embodiments, the reinforcement structure 300C is formed on the first surface 400a of the wiring substrate 400 through a printing process, a dispensing process, a combination thereof, or the like. In some embodiments, the reinforcement structure 300C may be cured after being placed on the first surface 400a of the wiring substrate 400.

Similar to the reinforcement structure 300 in FIG. 1G, the reinforcement structure 300C may also enhance the structure rigidity against bending stress generated by the de-bonding process. As such, with the presence of the reinforcement structure 300C, the crack and/or delamination issue in the redistribution circuit structure 100 may be alleviated, thereby enhancing the yield and reliability of the package structure 30.

Figure 9:
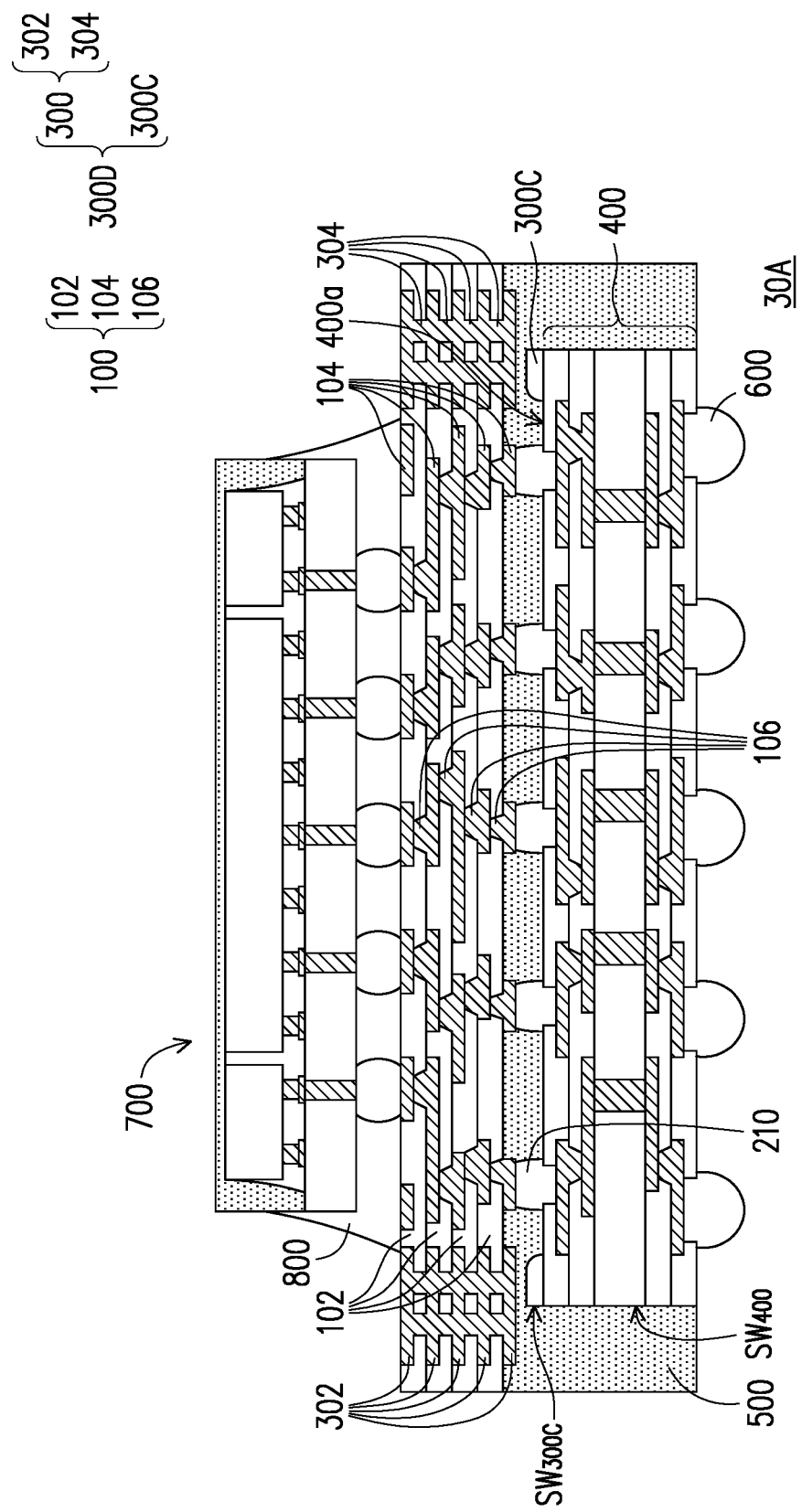

Referring to FIG. 9, a package structure 30A is shown. The package structure 30A in FIG. 9 is similar to the package structure 30 in FIG. 8, so similar elements are denoted by the same reference numeral and the detailed descriptions thereof are omitted herein. The difference between the package structure 30A illustrated in FIG. 9 and the package structure 30 illustrated in FIG. 8 lies in that the reinforcement structure 300C in FIG. 8 is replaced by a reinforcement structure 300D in FIG. 9. As illustrated in FIG. 9, the reinforcement structure 300D is a combination of a reinforcement structure 300 and a reinforcement structure 300C. The reinforcement structure 300 in FIG. 9 is similar to the reinforcement structure 300 in FIG. 1G, so the detailed description thereof is omitted herein. On the other hand, the reinforcement structure 300C in FIG. 9 is similar to the reinforcement structure 300C in FIG. 8, so the detailed description thereof is omitted herein. Similar to the reinforcement structure 300 in FIG. 1G and the reinforcement structure 300C in FIG. 8, the reinforcement structure 300D may also enhance the structure rigidity against bending stress generated by the de-bonding process and cutting stress generated by the dicing process. As such, with the presence of the reinforcement structure 300D, the crack and/or delamination issue in the redistribution circuit structure 100 may be alleviated, thereby enhancing the yield and reliability of the package structure 30A.

Figure 10:
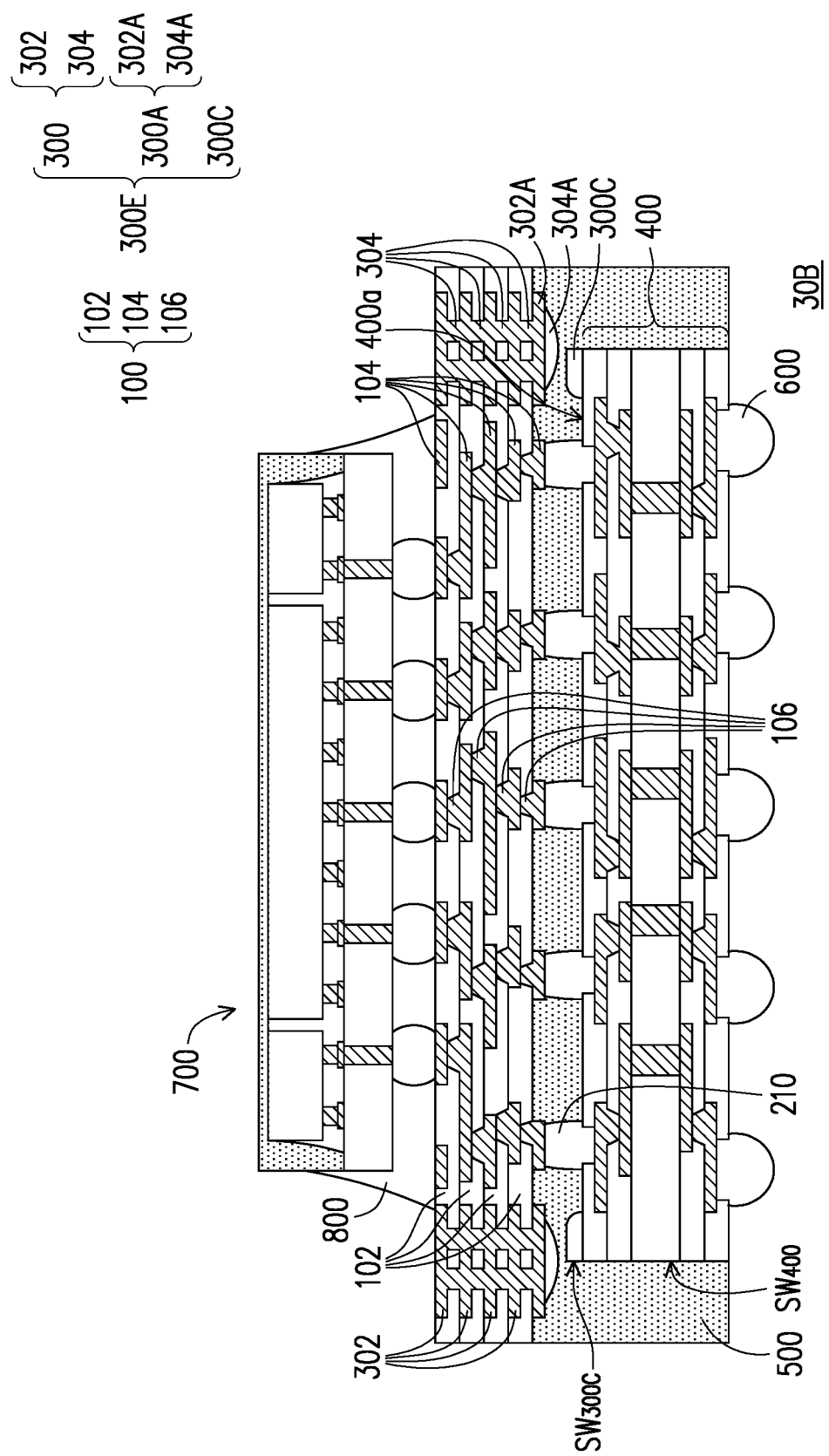

Referring to FIG. 10, a package structure 30B is shown. The package structure 30B in FIG. 10 is similar to the package structure 30 in FIG. 8, so similar elements are denoted by the same reference numeral and the detailed descriptions thereof are omitted herein. The difference between the package structure 30B illustrated in FIG. 10 and the package structure 30 illustrated in FIG. 8 lies in that the reinforcement structure 300C in FIG. 8 is replaced by a reinforcement structure 300E in FIG. 10. As illustrated in FIG. 10, the reinforcement structure 300E is a combination of a reinforcement structure 300, a reinforcement structure 300A, and a reinforcement structure 300C. The reinforcement structure 300 in FIG. 10 is similar to the reinforcement structure 300 in FIG. 1G, so the detailed description thereof is omitted herein. On the other hand, the reinforcement structure 300A in FIG. 10 is similar to the reinforcement structure 300A in FIG. 5G, so the detailed description thereof is omitted herein. Moreover, the reinforcement structure 300C in FIG. 10 is similar to the reinforcement structure 300C in FIG. 8, so the detailed description thereof is omitted herein. Similar to the reinforcement structure 300 in FIG. 1G, the reinforcement structure 300A in FIG. 5G, and the reinforcement structure 300C in FIG. 8, the reinforcement structure 300E may also enhance the structure rigidity against bending stress generated by the de-bonding process and cutting stress generated by the dicing process. As such, with the presence of the reinforcement structure 300E, the crack and/or delamination issue in the redistribution circuit structure 100 may be alleviated, thereby enhancing the yield and reliability of the package structure 30B.

Figure 11:
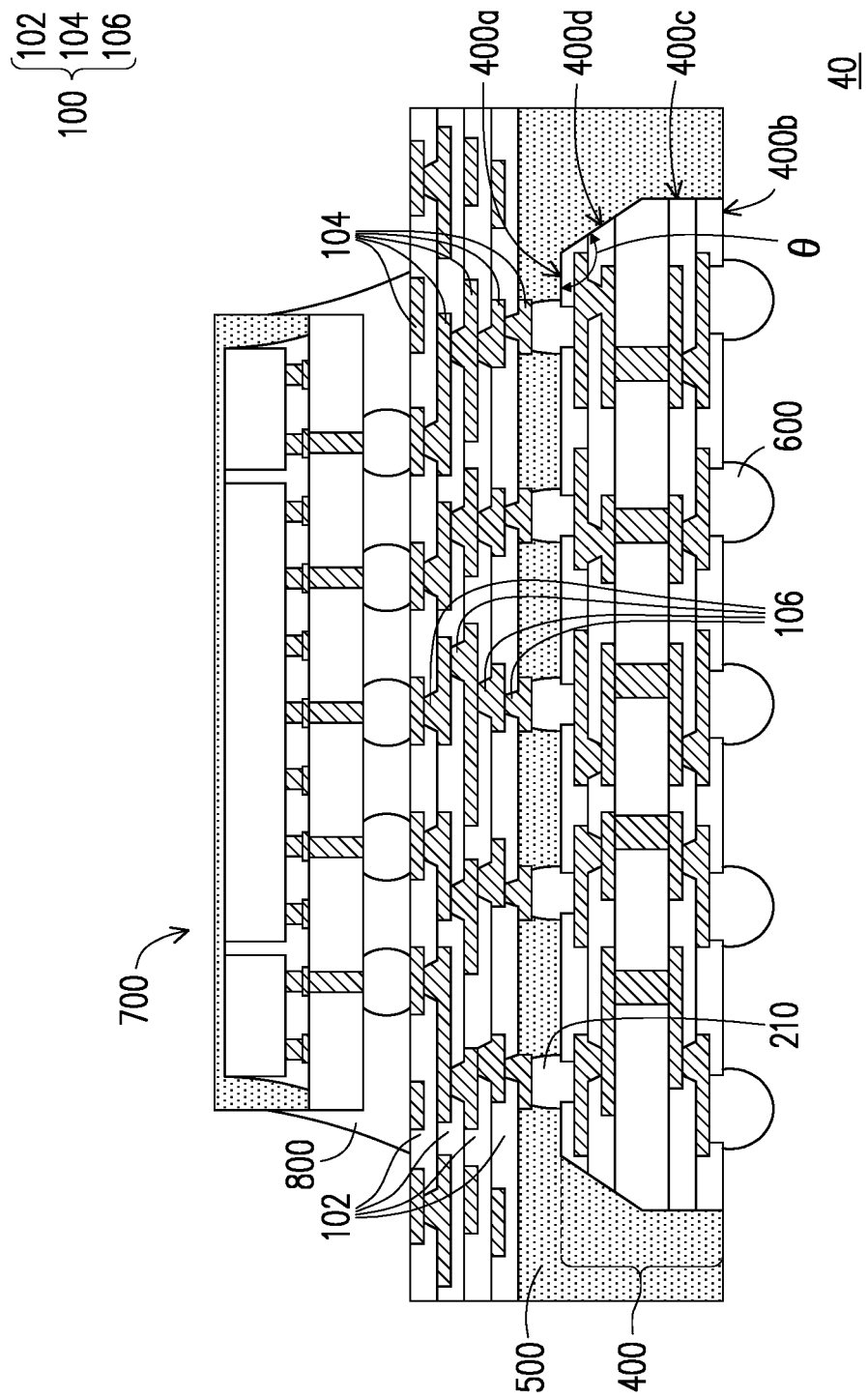

Referring to FIG. 11, a package structure 40 is shown. The package structure 40 in FIG. 11 is similar to the package structure 10 in FIG. 1G, so similar elements are denoted by the same reference numeral and the detailed descriptions thereof are omitted herein. The difference between the package structure 40 illustrated in FIG. 11 and the package structure 10 illustrated in FIG. 1G lies in that the reinforcement structure 300 in FIG. 1G is omitted in the package structure 40 of FIG. 11. Moreover, the wiring substrate 400 in the package structure 40 of FIG. 11 has beveled edges 400d. In some embodiments, corners on one side of the wiring substrate 400 are cut to form the beveled edges 400d. In some embodiments, the beveled edges 400d are tapered surfaces. As illustrated in FIG. 11, the wiring substrate 400 has a first surface 400a, a second surface 400b, sidewalls 400c, and the beveled edges 400d. In some embodiments, the second surface 400b is opposite to the first surface 400a. The sidewalls 400c are connected to the second surface 400b. On the other hand, the beveled edges 400d are connected to the sidewalls 400c and the first surface 400a. In other words, the sidewalls 400c connect the second surface 400b and the beveled edges 400d while the beveled edges 400d connect the sidewalls 400c and the first surface 400a. In some embodiments, each beveled edge 400d and the first surface 400a form an included angle θ greater than 90° and less than 180°. That is, each beveled edge 400d and the first surface 400a form an obtuse angle. In some embodiments, the beveled edges 400d are formed to face the redistribution circuit structure 100. Similar to the reinforcement structure 300 in FIG. 1G, the beveled edges 400d formed on the wiring substrate 400 may also enhance the structure rigidity against bending stress generated by the de-bonding process. As such, with the presence of the beveled edges 400d, the crack and/or delamination issue in the redistribution circuit structure 100 may be alleviated, thereby enhancing the yield and reliability of the package structure 40.

Figure 12:
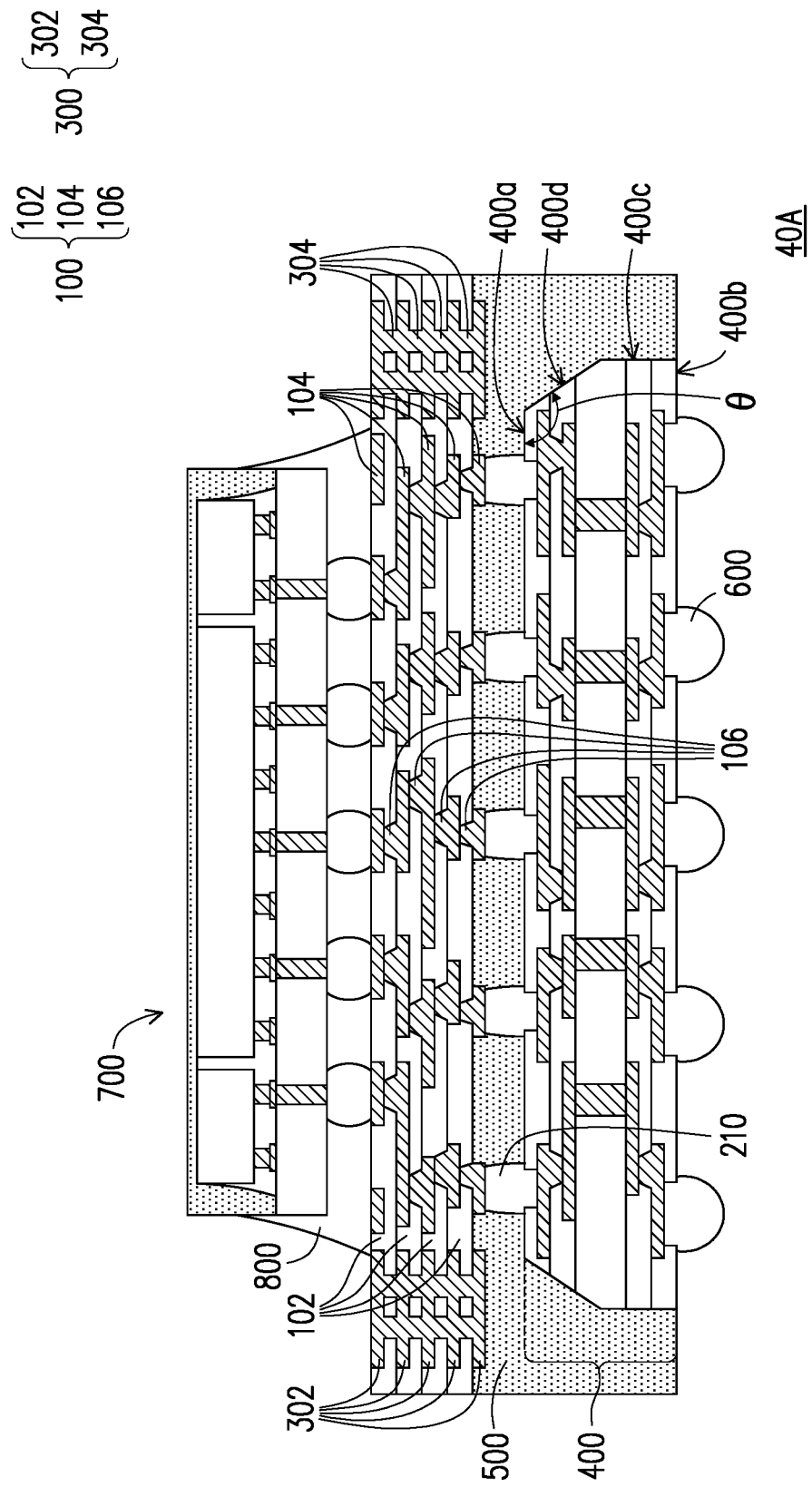

Referring to FIG. 12, a package structure 40A is shown. The package structure 40A in FIG. 12 is similar to the package structure 40 in FIG. 11, so similar elements are denoted by the same reference numeral and the detailed descriptions thereof are omitted herein. The difference between the package structure 40A illustrated in FIG. 12 and the package structure 40 illustrated in FIG. 11 lies in that the package structure 40A in FIG. 12 further includes a reinforcement structure 300 partially embedded in the redistribution circuit structure 100. In some embodiments, the reinforcement structure 300 is directly in contact with the insulating encapsulation 500. The reinforcement structure 300 in FIG. 12 is similar to the reinforcement structure 300 in FIG. 1G, so the detailed description thereof is omitted herein. Similar to the beveled edges 400d in FIG. 11 and the reinforcement structure 300 in FIG. 1G, the combination of the beveled edges 400d and the reinforcement structure 300 in FIG. 12 may also enhance the structure rigidity against bending stress generated by the de-bonding process and cutting stress generated by the dicing process. As such, with the presence of the beveled edges 400d and the reinforcement structure 300, the crack and/or delamination issue in the redistribution circuit structure 100 may be alleviated, thereby enhancing the yield and reliability of the package structure 40A.

Figure 13:
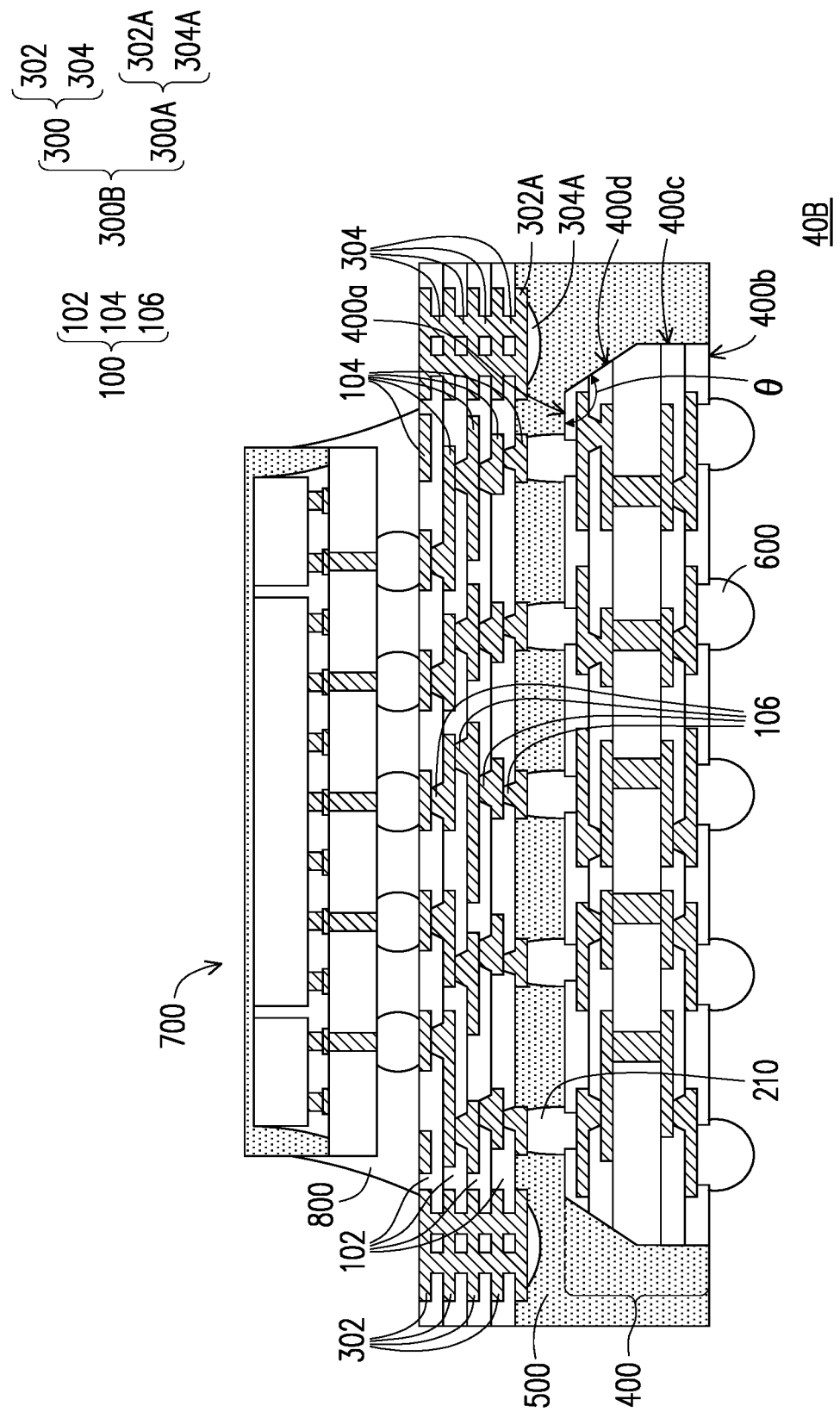

Referring to FIG. 13, a package structure 40B is shown. The package structure 40B in FIG. 13 is similar to the package structure 40 in FIG. 11, so similar elements are denoted by the same reference numeral and the detailed descriptions thereof are omitted herein. The difference between the package structure 40B illustrated in FIG. 13 and the package structure 40 illustrated in FIG. 11 lies in that the package structure 40B in FIG. 13 further includes a reinforcement structure 300B partially embedded in the redistribution circuit structure 100. In some embodiments, the reinforcement structure 300B is partially disposed on the redistribution circuit structure 100 and is partially located between the redistribution circuit structure 100 and the wiring substrate 400. In some embodiments, the reinforcement structure 300B is directly in contact with the insulating encapsulation 500. The reinforcement structure 300B in FIG. 13 is similar to the reinforcement structure 300B in FIG. 7, so the detailed description thereof is omitted herein. Similar to the beveled edges 400d in FIG. 11 and the reinforcement structure 300B in FIG. 7, the combination of the beveled edges 400d and the reinforcement structure 300B in FIG. 13 may also enhance the structure rigidity against bending stress generated by the de-bonding process and cutting stress generated by the dicing process. As such, with the presence of the beveled edges 400d and the reinforcement structure 300B, the crack and/or delamination issue in the redistribution circuit structure 100 may be alleviated, thereby enhancing the yield and reliability of the package structure 40B.

Figure 14:
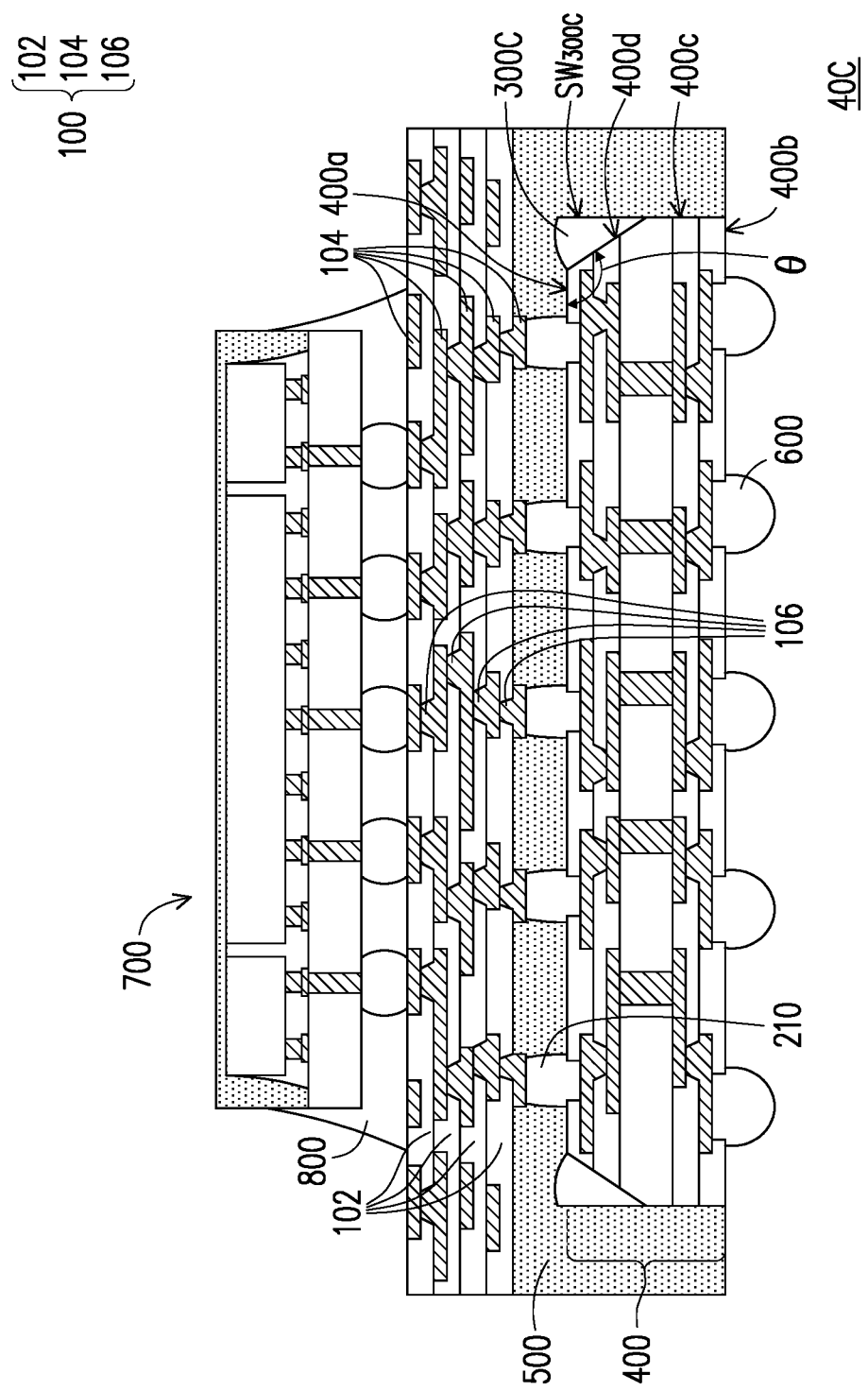

Referring to FIG. 14, a package structure 40C is shown. The package structure 40C in FIG. 14 is similar to the package structure 40 in FIG. 11, so similar elements are denoted by the same reference numeral and the detailed descriptions thereof are omitted herein. The difference between the package structure 40C illustrated in FIG. 14 and the package structure 40 illustrated in FIG. 11 lies in that the package structure 40C in FIG. 14 further includes a reinforcement structure 300C which covers the beveled edges 400d of the wiring substrate 400. In some embodiments, sidewalls $SW_{300C}$ of the reinforcement structure 300C are aligned with sidewalls 400c of the wiring substrate 400. In some embodiments, the reinforcement structure 300C is directly in contact with the insulating encapsulation 500. The reinforcement structure 300C in FIG. 14 is similar to the reinforcement structure 300C in FIG. 8, so the detailed description thereof is omitted herein. Similar to the beveled edges 400d in FIG. 11 and the reinforcement structure 300C in FIG. 8, the combination of the beveled edges 400d and the reinforcement structure 300C in FIG. 14 may also enhance the structure rigidity against bending stress generated by the de-bonding process and cutting stress generated by the dicing process. As such, with the presence of the beveled edges 400d and the reinforcement structure 300C, the crack and/or delamination issue in the redistribution circuit structure 100 may be alleviated, thereby enhancing the yield and reliability of the package structure 40C.

In accordance with some embodiments of the disclosure, a package structure includes a redistribution circuit structure, a wiring substrate, a semiconductor device, an insulating encapsulation, and a reinforcement structure. The redistribution circuit structure has a first surface and a second surface opposite to the first surface. The wiring substrate is disposed on the first surface of the redistribution circuit structure. The semiconductor device is disposed on the second surface of the redistribution circuit structure. The insulating encapsulation laterally encapsulates the wiring substrate. The reinforcement structure is directly in contact with the insulating encapsulation.

In accordance with some alternative embodiments of the disclosure, a package structure includes a redistribution circuit structure, a wiring substrate, a semiconductor device, and an insulating encapsulation. The wiring substrate is disposed on the redistribution circuit structure. The wiring substrate has beveled edges. The semiconductor device is disposed on the redistribution circuit structure opposite to the wiring substrate. The insulating encapsulation laterally encapsulates the wiring substrate.

In accordance with some embodiments of the disclosure, a manufacturing method of a package includes at least the following steps. A carrier is provided. A redistribution circuit structure having a first surface and a second surface opposite to the first surface is formed. A reinforcement structure is formed over the carrier. A wiring substrate is mounted on the first surface of the redistribution circuit structure. A sidewall of the wiring substrate is overlapped with the reinforcement structure along a direction perpendicular to the first surface of the redistribution circuit structure. The wiring substrate and the reinforcement structure are encapsulated by an insulating encapsulation. The redistribution circuit structure is de-bonded from the carrier. A semiconductor device is mounted on the second surface of the redistribution circuit structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a redistribution circuit structure comprising dielectric layers;
a wiring substrate disposed on the redistribution circuit structure;
an insulating encapsulation laterally encapsulating the wiring substrate; and
a reinforcement structure comprising reinforcement pattern layers and reinforcement vias, the reinforcement pattern layers and the dielectric layers are stacked alternately, the reinforcement vias penetrate through the dielectric layers to connect the reinforcement pattern layers, at least one of the reinforcement pattern layers is embedded in the insulating encapsulation, and the reinforcement structure is electrically floating.

2. The package structure of claim 1, wherein a sidewall of the wiring substrate is overlapped with the reinforcement structure from a top view.

3. The package structure of claim 1, wherein the topmost reinforcement pattern layer is embedded in the insulating encapsulation.

4. The package structure of claim 3, wherein the reinforcement structure further comprises reinforcement bumps disposed on the topmost reinforcement pattern layer, and the reinforcement bumps are embedded in the insulating encapsulation.

5. The package structure of claim 1, wherein the reinforcement structure is made of conductive materials.

6. The package structure of claim 1, wherein the redistribution circuit structure further comprises conductive pattern layers and conductive vias, the conductive vias penetrate through the dielectric layers to connect the conductive pattern layers, and the topmost conductive pattern layer and the topmost reinforcement pattern layer are located at a same level height.

7. The package structure of claim 6, wherein the bottommost conductive pattern layer and the bottommost reinforcement pattern layer are located at a same level height.

8. The package structure of claim 1, further comprising a semiconductor device in physical contact with the redistribution circuit structure, wherein the semiconductor device is disposed opposite to the wiring substrate.

9. A package structure, comprising:
a redistribution circuit structure;
a wiring substrate disposed on a first side of the redistribution circuit structure;
a first reinforcement structure disposed on the first side of the redistribution circuit structure, wherein the first reinforcement structure comprises a first reinforcement pattern layer and reinforcement bumps disposed on the first reinforcement pattern layer; and an insulating encapsulation laterally encapsulating the wiring substrate and the first reinforcement structure.

10. The package structure of claim 9, wherein a sidewall of the wiring substrate is overlapped with the first reinforcement structure from a top view.

11. The package structure of claim 9, further comprising a second reinforcement structure, and the second reinforcement structure is embedded in the redistribution circuit structure.

12. The package structure of claim 11, wherein the redistribution circuit structure comprises dielectric layers, conductive pattern layers, and conductive vias, the conductive pattern layers and the dielectric layers are stacked alternately, the conductive vias penetrate through the dielectric layers to connect the conductive pattern layers, the second reinforcement structure comprises second reinforcement pattern layers and reinforcement vias, the second reinforcement pattern layers and the dielectric layers are stacked alternately, and the reinforcement vias penetrate through the dielectric layers to connect the second reinforcement pattern layers.

13. The package structure of claim 11, wherein the second reinforcement structure is made of conductive materials.

14. The package structure of claim 9, wherein the first reinforcement structure is made of conductive materials.

15. The package structure of claim 9, wherein the reinforcement bumps are rectangular bumps or circular bumps from a top view.

16. The package structure of claim 9, wherein the first reinforcement pattern layer comprises aluminum, titanium, copper, nickel, tungsten, or alloys thereof.

17. The package structure of claim 9, wherein the reinforcement bumps comprises solder materials.

18. A manufacturing method of a package structure, comprising:

simultaneously forming a redistribution circuit structure and a reinforcement structure, wherein the redistribution circuit structure comprises dielectric layers, the reinforcement structure comprises reinforcement pattern layers and reinforcement vias, the reinforcement pattern layers and the dielectric layers are stacked alternately, the reinforcement vias penetrate through the dielectric layers to connect the reinforcement pattern layers, and the reinforcement structure is electrically floating;

mounting a wiring substrate on the redistribution circuit structure; and encapsulating the wiring substrate and the topmost reinforcement pattern layer by an insulating encapsulation.

19. The method of claim 18, wherein the redistribution circuit structure further comprises conductive pattern layers and conductive vias, the conductive vias penetrate through the dielectric layers to connect the conductive pattern layers, and the conductive pattern layer and the corresponding reinforcement pattern layer located at a same level height are simultaneously formed.

20. The method of claim 19, further comprising forming conductive coatings over the topmost conductive pattern layer of the redistribution circuit structure and the topmost reinforcement pattern layer of the reinforcement structure.

* * * * *